US010031989B2

United States Patent
Alfano et al.

(10) Patent No.: US 10,031,989 B2
(45) Date of Patent: Jul. 24, 2018

(54) INTEGRATED CIRCUIT PERFORMANCE MODELING USING A CONNECTIVITY-BASED CONDENSED RESISTANCE MODEL FOR A CONDUCTIVE STRUCTURE IN AN INTEGRATED CIRCUIT

(71) Applicant: GLOBALFOUNDRIES INC., Grand Cayman (KY)

(72) Inventors: Ralph M. Alfano, Larchmont, NY (US); Arnold E. Baizley, Underhill, VT (US); Ning Lu, Essex Junction, VT (US); Judith H. McCullen, Essex Junction, VT (US); Cole E. Zemke, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 613 days.

(21) Appl. No.: 14/546,065

(22) Filed: Nov. 18, 2014

(65) Prior Publication Data
US 2016/0140273 A1    May 19, 2016

(51) Int. Cl.
G06F 17/50    (2006.01)

(52) U.S. Cl.
CPC .................... *G06F 17/5036* (2013.01)

(58) Field of Classification Search
CPC ............. G06F 17/5036; G06F 17/5081; G06F 17/5045; H01L 2924/0002; H01L 21/76895
See application file for complete search history.

(56) References Cited

U.S. PATENT DOCUMENTS 5,384,710 A    1/1995    Lam et al.
5,717,242 A    2/1998    Michael et al.
(Continued)

FOREIGN PATENT DOCUMENTS

CN    1834967 A   *   9/2006
CN    202961962 U       6/2013
(Continued)

OTHER PUBLICATIONS

R. Mandal et al., "Reducing Library Development Cycle Time Through an Optimum Layout Create Flow," Asia and South Pacific Design Automation Conference, 2002, 655, 6 pages.
(Continued)

*Primary Examiner* — Omar F Fernandez Rivas
*Assistant Examiner* — Justin C Mikowski
(74) *Attorney, Agent, or Firm* — Gibb & Riley, LLC; Anthony J. Canale

(57) ABSTRACT

Disclosed are a system and a method for integrated circuit (IC) performance modeling, wherein a design layout of an IC is analyzed to identify a first conductive shape (e.g., an internal local interconnect or contact bar shape) on a diffusion boundary shape of a semiconductor device and to also identify the first conductive shape's connectivity to any second conductive shapes (e.g., a via, via bar, or external local interconnect shapes) inside and/or outside the limits of the diffusion boundary shape. A condensed resistance model for the first conductive shape is selected from a model library based on the previously identified connectivity. The selected condensed resistance model will have a lesser number of nodes and/or resistive elements than a full resistance model for the conductive shape. The selected condensed resistance model is used to construct a condensed netlist, which is used in a combined netlist to simulate IC performance.

20 Claims, 13 Drawing Sheets

(56) References Cited

U.S. PATENT DOCUMENTS

| | | | |
|---|---|---|---|
| 5,924,008 A | 7/1999 | Michael et al. | |
| 5,970,375 A | 10/1999 | Gardner et al. | |
| 5,999,726 A | 12/1999 | Ho | |
| 6,064,806 A | 5/2000 | Lakos et al. | |
| 6,169,302 B1 | 1/2001 | Long et al. | |
| 6,207,575 B1 | 3/2001 | Yang et al. | |
| 6,230,299 B1 | 5/2001 | McSherry et al. | |
| 6,239,491 B1 | 5/2001 | Pasch et al. | |
| 6,438,729 B1 | 8/2002 | Ho | |
| 6,448,631 B2 | 9/2002 | Gandhi et al. | |
| 6,486,056 B2 | 11/2002 | Pasch et al. | |
| 6,594,813 B1 | 7/2003 | Gandhi et al. | |
| 6,842,714 B1* | 1/2005 | Acar | G01R 31/3008 702/136 |
| 7,069,527 B1 | 6/2006 | Leonhardt | |
| 7,421,383 B2 | 9/2008 | Hsiao et al. | |
| 7,480,878 B2 | 1/2009 | Holesovsky et al. | |
| 8,095,172 B1 | 1/2012 | Cole et al. | |
| 8,146,032 B2 | 3/2012 | Chen et al. | |
| 8,161,469 B1 | 4/2012 | Iotov et al. | |
| 8,499,273 B1 | 7/2013 | Bozman et al. | |
| 8,522,181 B2 | 8/2013 | Nieuwoudt et al. | |
| 8,572,537 B2 | 10/2013 | Su et al. | |
| 8,782,587 B2 | 7/2014 | Nayak et al. | |
| 2004/0024533 A1 | 2/2004 | Ohta | |
| 2004/0073418 A1* | 4/2004 | Nassif | G06F 17/5036 703/19 |
| 2004/0210858 A1 | 10/2004 | Hayashi et al. | |
| 2006/0173250 A1* | 8/2006 | Nessler | A61B 18/16 600/306 |
| 2007/0044056 A1 | 2/2007 | Minter et al. | |
| 2013/0007686 A1* | 1/2013 | Lu | G06F 17/5036 716/115 |
| 2013/0087886 A1 | 4/2013 | Chen et al. | |
| 2013/0126978 A1 | 5/2013 | Becker et al. | |
| 2013/0166709 A1 | 6/2013 | Doane et al. | |
| 2013/0298100 A1* | 11/2013 | Hastings | G06F 17/50 716/126 |
| 2013/0339915 A1 | 12/2013 | Nieuwoudt et al. | |
| 2014/0333317 A1* | 11/2014 | Frost | G01R 31/3606 324/430 |

FOREIGN PATENT DOCUMENTS

| | | |
|---|---|---|
| CN | 103390086 A | 11/2013 |
| EP | 0146491 A2 | 6/1985 |

OTHER PUBLICATIONS

A. Krinke et al., "Extended Constraint Management for Analog and Mixed-Signal IC Design," European Conference on Circuit Theory and Design (ECCTD), 2013, 4 pages.

* cited by examiner

INTEGRATED CIRCUIT PERFORMANCE MODELING USING A CONNECTIVITY-BASED CONDENSED RESISTANCE MODEL FOR A CONDUCTIVE STRUCTURE IN AN INTEGRATED CIRCUIT

BACKGROUND

The present invention relates to modeling the performance of an integrated circuit and, more particularly, to a system, a method and a computer program product for modeling the performance of an integrated circuit using a connectivity-based condensed resistance model for a conductive structure (e.g., a local interconnect, contact bar or other conductive structure) on a diffusion region of a semiconductor device in the integrated circuit.

Traditionally, the performance (i.e., behavioral characteristics, current-voltage (I-V) characteristics, etc.) of an integrated circuit is modeled by generating, from the design layout, full resistance models for all components of the integrated circuit including for all active devices, all passive devices and all interconnects within and between those active and passive devices. The component-level resistance models are used to generate component-level netlists and the component-level netlists are used to form a combined netlist for the integrated circuit itself. Simulations of the combined netlist are then performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. Based on the results of the simulations, a performance model for the integrated circuit is generated. Unfortunately, as the complexity of integrated circuits increases (i.e., as the number and complexity of active devices, passive devices and interconnects incorporated into integrated circuits increases), so does the amount of time and processing capability required to complete simulations and generate performance models. Therefore, there is a need for an improved and, particularly, faster method of accurately modeling the performance of an integrated circuit.

SUMMARY

In view of the foregoing, disclosed herein are a system, a method and a computer program product for modeling the performance of an integrated circuit using a connectivity-based condensed resistance model for a conductive structure on a diffusion region of a semiconductor device within the integrated circuit. Specifically, in the system, method, and computer program product, the design layout of the integrated circuit can be analyzed in order to identify a first conductive shape (e.g., an internal local interconnect shape, a contact bar shape, or any other conductive shape) on a diffusion boundary shape of a semiconductor device and to also identify the first conductive shape's connectivity to any second conductive shapes (e.g., any via shapes, via bar shapes, external local interconnect shapes or any other conductive shapes) inside and/or outside the limits of the diffusion boundary shape. A condensed resistance model for the first conductive shape can be selected from a model library based on the previously identified connectivity. The selected condensed resistance model can have a lesser number of nodes and/or a lesser number of resistive elements than a full resistance model for the first conductive shape. The selected condensed resistance model can be used to generate a condensed netlist for the first conductive shape, which can subsequently be used in a combined netlist to simulate the performance of the integrated circuit in a faster and more efficient manner.

More particularly, disclosed herein is an integrated circuit performance modeling system. This system can comprise a memory that stores a design layout of an integrated circuit. This system can further comprise an integrated circuit design layout analyzer that accesses the memory and analyzes the design layout. Specifically, the layout analyzer can analyze the design layout in order to identify, in the design layout, a diffusion boundary shape of a semiconductor device, a first conductive shape (e.g., an internal local interconnect shape, a contact bar shape or any other conductive shape) on the diffusion boundary shape and any second conductive shapes (e.g., any via shapes, via bar shapes, external local interconnect shapes or any other conductive shapes) connected to the first conductive shape. The layout analyzer can further identify, for each second conductive shape identified as being connected to the first conductive shape, a corresponding interface location between the second conductive shape and the first conductive shape relative to the diffusion boundary shape. That is, the layout analyzer can determine whether any second conductive shapes contact the first conductive shape and, if so, whether the interface location (i.e., the location of the point of connectivity, also referred to herein as the point of contact) between each given second conductive shape and the first conductive shape is entirely outside the diffusion boundary shape or at least partially within the diffusion boundary shape.

The system can further comprise a model library, which stores a plurality of connectivity-based condensed resistance models.

The system can further comprise a model selector, which is in communication with the integrated circuit design layout analyzer and the model library and which can select, from the model library, a specific condensed resistance model for the first conductive shape based on any corresponding interface locations between any second conductive shapes and the first conductive shape relative to the diffusion boundary shape. That is, the model selector can select a specific condensed resistance model for the first conductive shape from the model library and can do so based on the presence or absence of any second conductive shapes connected to the first conductive shape and further based on whether the corresponding interface locations of any second conductive shapes, if present, are entirely outside the diffusion boundary shape or at least partially within the diffusion boundary shape. In any case, the specific condensed resistance model selected will have a lesser number of nodes and/or a lesser number of resistive elements than a full resistance model for the first conductive shape.

The system can further comprise a netlist extractor, which is in communication with the model selector and which can extract a condensed netlist for the first conductive shape based on the specific condensed resistance model.

The system can also comprise a simulator, which is in communication with the netlist extractor and which can simulate the performance of the integrated circuit using that condensed netlist for the first conductive shape.

Also disclosed herein is an integrated circuit performance modeling method. This method can comprise analyzing the design layout of an integrated circuit in order to identify, in the design layout, a diffusion boundary shape of a semiconductor device, a first conductive shape (e.g., an internal local interconnect shape, a contact bar shape or any other conductive shape) on the diffusion boundary shape and any second conductive shapes (e.g., any via shapes, via bar shapes, external local interconnect shapes or any other conductive shapes) connected to the first conductive shape. The design layout can further be analyzed in order to identify, for each second conductive shape identified as being connected to the first conductive shape, a corresponding interface location between the second conductive shape and the first conductive shape relative to the diffusion boundary shape. That is, the design layout can be analyzed in order to determine whether any second conductive shapes contact the first conductive shape and, if so, whether the interface location (i.e., the location of the point of connectivity, also referred to herein as the point of contact) between each given second conductive shape and the first conductive shape is entirely outside the diffusion boundary shape or at least partially within the diffusion boundary shape.

The method can further comprise selecting a specific condensed resistance model for the first conductive shape from a model library, which stores a plurality of connectivity-based condensed resistance models. Selection of the specific condensed resistance model can specifically be based on any corresponding interface locations between any second conductive shapes and the first conductive shape relative to the diffusion boundary shape. That is, the specific condensed resistance model for the first conductive shape can be selected from the model library based on the presence or absence of any second conductive shapes connected to the first conductive shape and further based on whether the corresponding interface locations of any second conductive shapes, if present, are entirely outside the diffusion boundary shape or at least partially within the diffusion boundary shape. In any case, the specific condensed resistance model selected will have a lesser number of nodes and/or a lesser number of resistive elements than a full resistance model for the first conductive shape.

The method can further comprise generating a condensed netlist for the first conductive shape based on the specific condensed resistance model and simulating the performance of the integrated circuit using that condensed netlist.

Also disclosed herein is a computer program product for integrated circuit performance modeling. The computer program product can comprise a computer readable storage medium having program instructions embodied therewith (e.g., stored thereon). These program instructions can be executable by the computer to cause the computer to perform the above-described method.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
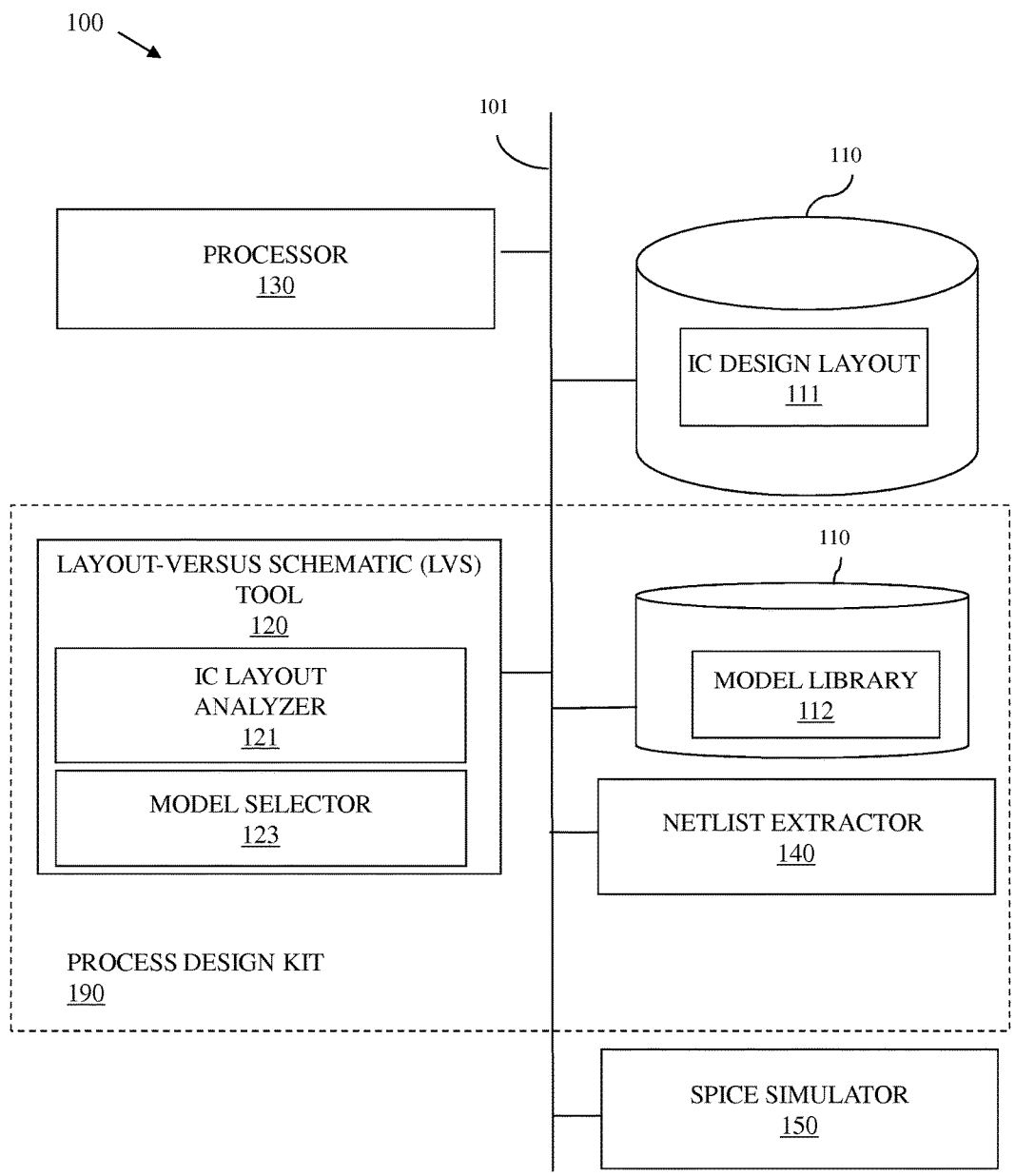
FIG. 1 is a schematic diagram illustrating an integrated circuit performance modeling system.

As mentioned above, traditionally, the performance (i.e., behavioral characteristics, current-voltage (I-V) characteristics, etc.) of an integrated circuit is modeled by generating, from the design layout, full resistance models for all components of the integrated circuit including for all active devices, all passive devices and all interconnects within and between those active and passive devices. The component-level resistance models are used to generate component-level netlists and the component-level netlists are used to form a combined netlist for the integrated circuit itself. Simulations of the combined netlist are then performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. Based on the results of the simulations, a performance model for the integrated circuit is generated. Unfortunately, as the complexity of integrated circuits increases (i.e., as the number and complexity of active devices, passive devices and interconnects incorporated into integrated circuits increases), so does the amount of time and processing capability required to complete simulations and generate performance models. Therefore, there is a need for an improved and, particularly, faster method of accurately modeling the performance of an integrated circuit.

In view of the foregoing, disclosed herein are a system, a method and a computer program product for modeling the performance of an integrated circuit using connectivity-based condensed resistance model for a conductive structure on a diffusion region of a semiconductor device within the integrated circuit. Specifically, in the system, method, and computer program product, the design layout of the integrated circuit can be analyzed in order to identify a first conductive shape (e.g., an internal local interconnect shape, a contact bar shape, or any other conductive shape) on a diffusion boundary shape of a semiconductor device and to also identify the first conductive shape's connectivity to any adjacent second conductive shapes (e.g., any via shapes, via bar shapes, external local interconnect shapes or any other conductive shapes) inside and/or outside the limits of the diffusion boundary shape. A condensed resistance model for the first conductive shape can be selected from a model library based on the previously identified connectivity. The selected condensed resistance model can have a lesser number of nodes and/or a lesser number of resistive elements than a full resistance model for the first conductive shape. The selected condensed resistance model can be used to generate a condensed netlist, which can subsequently be used in a combined netlist to simulate the performance of the integrated circuit in a faster and more efficient manner.

Referring to FIG. 1, disclosed herein is an integrated circuit performance modeling system 100. The modeling system 100 can be implemented in a computer system, such as that described in detail below and illustrated in FIG. 12, which is programmed with one or more software programs and/or incorporates special purpose hardware components so that it comprises a special purpose computer system for integrated circuit performance modeling and, particularly, for integrated circuit performance modeling, as disclosed.

The modeling system 100 can comprise one or more memories 110 (e.g., a computer readable storage medium, as defined below), which store an integrated circuit design layout 111 (i.e., a design layout for specific integrated circuit) and a model library 112, and at least one processor 130 in communication with the memory 110 (e.g., over system bus 101, as illustrated or, alternatively, over a wired or wireless network).

The modeling system 100 can further comprise an integrated circuit design layout analyzer 121, a model selector 123, a netlist extractor 140 (also referred to herein as a parasitic extraction (PEX) tool) and a simulator 150 (e.g., a Simulation Program with Integrated Circuit Emphasis (SPICE) simulator). As will be appreciated by one skilled in the art, such components (i.e., the integrated circuit design layout analyzer 121, the model selector 123, the netlist extractor 140 and the simulator 150) may be implemented entirely in hardware, entirely in software (including firmware, resident software, micro-code, etc., which is stored in the memory(ies) 110 and which is executable by the processor(s) 130 to perform integrated circuit modeling) or in a combination of software and hardware. It should be noted that the layout analyzer 121 and model selector 123 could be discrete components. Alternatively, the layout analyzer 121 and model selector 123 could be components of another tool such as a layout-versus schematic (LVS) tool 120, as illustrated. Furthermore, it should be noted that the layout analyzer 121 and model selector 123 (or LVS tool 120) as well as the model library 112 and the netlist extractor 140 could all be discrete components. Alternatively, they could be components of a Process Design Kit (PDK) 190, as illustrated.

It should be understood that an integrated circuit can comprise a relatively large number (e.g., thousands) of active devices of various types, passive devices of various types, and the interconnects that provide electrical connections within and between the active devices and/or the passive devices. The active devices can comprise semiconductor devices including, for example, field effect transistors, capacitors, diodes, bipolar transistors, etc. The passive devices can comprise resistors, inductors, transformers, etc. The interconnects can comprise conductors including, for example, internal local interconnects that are below the back end of the line (BEOL) metal levels (i.e., below the first metal level) and that electrically connect diffusion regions within a semiconductor device; external local interconnects that are below the BEOL metal levels and that electrically connect diffusion regions of different semiconductor devices; and vias or via bars that extend vertically from device components or local interconnects up to the BEOL metal levels.

Figure 2A:
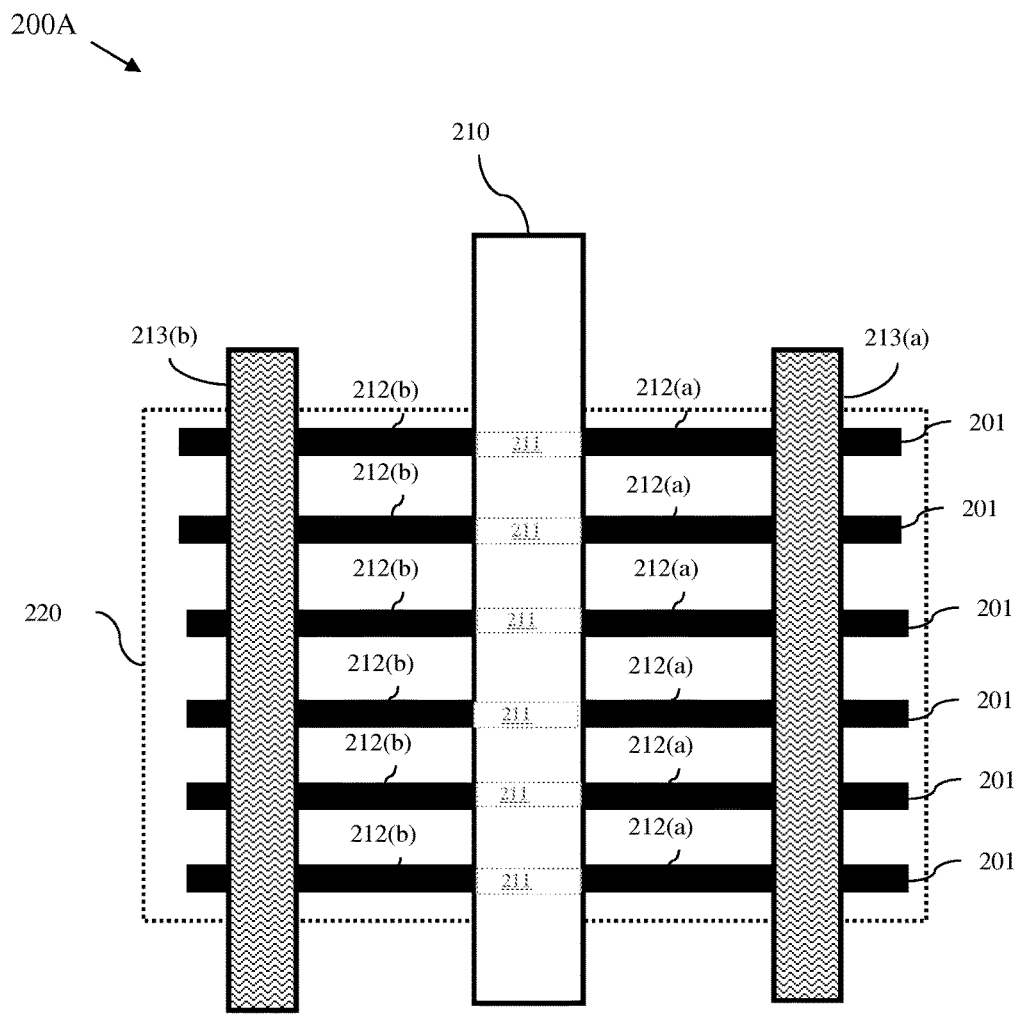
FIG. 2A is a top view diagram illustrating an exemplary non-planar MOSFET having a diffusion region and a conductive structure in contact with that diffusion region.
Figure 2B:
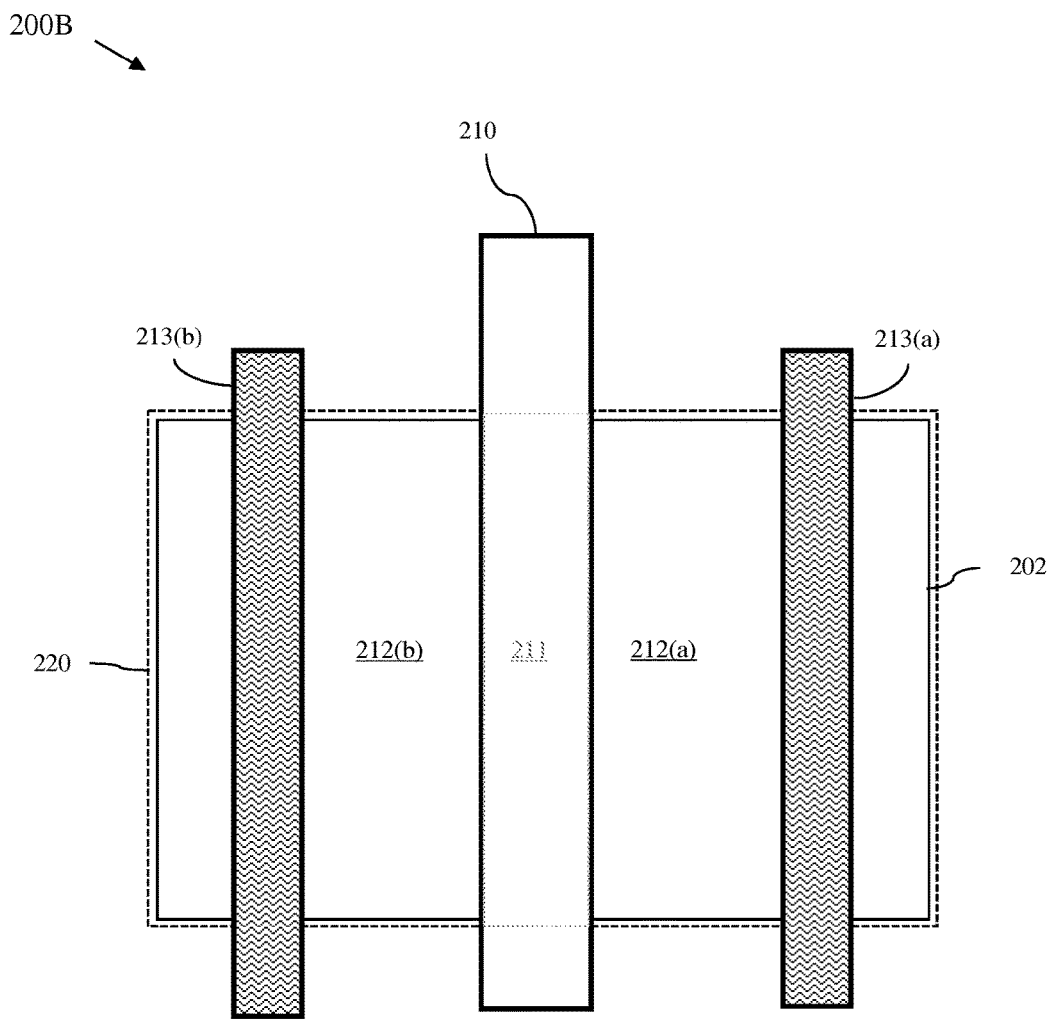
FIG. 2B is a top view diagram illustrating an exemplary planar MOSFET having a diffusion region and a conductive structure in contact with that diffusion region.

It should further be understood that the modeling system 100 disclosed herein pertains specifically to an integrated circuit that comprises at least one semiconductor device with at least one diffusion region and a conductive structure (e.g., an internal local interconnect, a contact bar, or other conductive structure) on and in contact with that diffusion region. FIGS. 2A-2B illustrate exemplary semiconductor devices and, particularly, metal oxide semiconductor (MOS) field effect transistors (FETs) 200A and 200B, respectively, each having a diffusion region 220 and at least one conductive structure on and in contact with that diffusion region 220. Specifically, FIG. 2A shows a non-planar MOSFET 200A (e.g., a fin-type field effect transistor (i.e., a finFET)) that incorporates multiple semiconductor fins 201. Each semiconductor fin 201 can comprise at least one channel region 211 positioned laterally between two source/drain regions 212(a)-(b). The diffusion region 220 encompasses all of the semiconductor fins 201 and, particularly, the source/drain regions 212(a)-(b) thereof. A gate 210 can traverse the multiple semiconductor fins 201 at their respective channel regions 211 and two conductive structures 213(a)-(b) (in this case two internal local interconnects) can traverse the semiconductor fins 201 at the source/drain regions 212(a)-(b) so as to electrically connect all of the source/drain regions 212(a) in the semiconductor fins 201 on one side of the gate 210 and so as to electrically connect all of the source/drain regions 212(b) in the semiconductor fins 201 on the opposite side of the gate 210, respectively. FIG. 2B shows a planar MOSFET 200B comprising a planar semiconductor body 202. The semiconductor body 202 can comprise a channel region 211 positioned laterally between two source/drain regions 212(a)-(b). The diffusion region 220 encompasses the entire semiconductor body 290 and, particularly, the source/drain regions 212(a)-(b). A gate 210 can traverse the semiconductor body 202 at the channel region 211 and two conductive structures 213(a)-(b) (in this case two contact bars) can traverse the semiconductor body 202 at the source/drain regions 212(a)-(b), respectively. Other exemplary semiconductor devices that may similarly have conductive structure(s) (e.g., internal local interconnect(s), contact bar(s) or other conductive structure(s)) on diffusion region(s) include, but are not limited to, MOS capacitors and diodes. For purposes of illustration, the modeling system 100 will be described in greater detail below and illustrated in the Figures with respect to the finFET 200A of FIG. 2A.

Generally, layout analysis and device recognition are performed (e.g., by the layout analyzer 121, which as mentioned above may be a component of an LVS tool 120) on an integrated circuit design layout 111 based on marker layers resulting in the generation of active device instances, passive device instances, as well as some component-level parasitic resistance and capacitance models. Next, the netlist extractor 140 (i.e., the PEX tool) adds various parasitic resistance and capacitance elements within and between those active and passive devices. Each component-level resistance model will include nodes and resistive elements associated with a given component. For a conductive structure (e.g., for the conductive structure 213(a) of the MOSFETs 200A and 200B of FIGS. 2A and 2B, respectively) device recognition by a layout analyzer 121 typically results in the generation of a component-level resistance model such as the full resistance model 300 shown in FIG. 3. This full resistance model 300 comprises four nodes 301-304 representative of four regions of the conductive structure 213(a) that can be contacted and five resistive elements 311-315 (i.e., resistors) representative of the resistance values between the four nodes 301-304. That is, node 301 represents the bottom of the conductive structure 213(a) on the diffusion region 220; node 302 represents the top of the conductive structure 213(a); and nodes 303 and 304 represent opposing ends of the conductive structure 213(a). Resistive element 311 represents the resistance value between the bottom node 301 and top node 302; resistive elements 312 and 313 represent resistance values between the bottom node 301 and each of the opposing end nodes 303 and 304, respectively; and resistive elements 314 and 315 represent resistance values between the top node 302 and each of the opposing end nodes 303 and 304, respectively. This full resistance model 300, which includes the 4 nodes and 5 resistive elements as described above, is typically used to represent a conductive structure, such as an internal local interconnect or a contact bar, regardless of that conductive structure's actual connectivity to other conductive structures including, for example, any external local interconnects, vias or via bars (which are not shown in FIG. 2A or 2B).

In the modeling system 100 disclosed herein the conductive structure's connectivity to other conductive structures is identified and knowledge of that connectivity is used to select a specific condensed resistance model, which has a lesser number of nodes and/or a lesser number of resistive elements (i.e., a lesser number of resistors) than the full resistance model 300. By reducing the number of nodes and/or resistive elements in the resistance model for the first conductive structure (e.g., for the internal local interconnect, contact bar, etc.) and, thereby in the netlist, which is generated based on that resistance model, this modeling system 100 reduces the number of simulation runs and the overall time required for integrated circuit performance modeling.

More particularly, the design layout 111 can comprise an object-based design layout that provides a geometric representation of the design of a specific integrated circuit. In an object-based design layout specific features (i.e., objects) of each of the various integrated circuit components can be identified by overlapping geometric shapes (also referred to herein as seed shapes) in, for example, different colors or patterns. For a semiconductor device, such as a MOSFET, these overlapping geometric shapes can include, but are not limited to, a diffusion boundary shape, a gate shape, first conductive shape(s) (e.g., internal local interconnect shape(s), contact bar shape(s) or other conductive shape(s)) that are on and in contact with the diffusion boundary shape and any second conductive shape(s) (i.e., via shape(s), via bar shape(s), external local interconnect shape(s) or other conductive shape(s)) that are directly connected to (i.e., immediately adjacent to, in direct physical contact with, etc.) the first conductive shape(s). For purposes of this disclosure, it should be understood that a diffusion boundary shape refers to a diffusion marker shape in IC design layout and corresponds to the diffusion region 220 referenced in FIGS. 2A and 2B.

The layout analyzer 121, which as mentioned above can be a component of a Layout-Versus-Schematic (LVS) tool 120) can access the memory 110 and can analyze the design layout 111 and, particularly, can sort the various geometric shapes within design layout 111 in order to identify one of the semiconductor devices at issue. That is, the layout analyzer 121 can identify a diffusion boundary shape of a semiconductor device and a first conductive shape comprising, for example, an internal local interconnect shape, a contact bar, or other conductive shape, on and in contact with the diffusion boundary shape. When such a first conductive shape is identified, the layout analyzer 121 can further identify second conductive shapes (e.g., via shapes, via bar shapes, external local interconnect shapes or other conductive shapes), if any, that are directly connected to (i.e., immediately adjacent to, in direct physical contact with, etc.) the first conductive shape. If any second conductive shapes are identified as being directly connected to the first conductive shape, the layout analyzer 121 can further identify, for each second conductive shape, a corresponding interface location (i.e., the location of the point of connectivity, also referred to herein as the point of contact) between the second conductive shape and the first conductive shape relative to the diffusion boundary shape (i.e., entirely outside the diffusion boundary shape or at least partially within the diffusion boundary shape).

In the modeling system 100, the model library 112, which as mentioned above can be a component of the Process Design Kit (PDK) 190, can store a plurality of connectivity-based condensed resistance models for various conductive structures (e.g., for internal local interconnects, contact bars or other conductive structures). These connectivity-based condensed resistance models can be previously generated (i.e., previously developed) and stored in the model library 112 and can vary based on the conductive structure's connectivity to any other conductive structure's and, particularly, can vary as a function of whether the conductive structure is electrically connected to and in direct physical contact with any other conductive structure and, if so, where that connection/contact occurs relative to the diffusion region.

In the modeling system 100, the model selector 123 can be in communication with the integrated circuit design layout analyzer 121 and the model library 112 and can select, from the model library 112, a specific condensed resistance model for the first conductive shape based on the results of the above-described analysis by the layout analyzer 121. Specifically, the model selector 123 can select a specific condensed resistance model for the first conductive shape by applying pre-established connectivity-based rules. These rules can dictate the number of nodes and the number of resistive elements between the nodes in the condensed resistance model to be selected based on the following: (1) the presence or absence of any second conductive shapes directly connected to the first conductive shape; and (2) when there is at least one second conductive shape connected to the first conductive shape, whether the interface location(s) between the second conductive shape(s) and the first conductive shape is/are entirely outside the diffusion boundary shape at one or both ends of the first conductive shape and/or whether those interface location(s) is/are at least partially within the diffusion boundary shape at the top of the first conductive shape.

Specifically, referring to the FETs 200A or 200B of FIG. 2A or 2B, respectively, the model selector 123 can partition the first conductive shape 213(a) (e.g., the internal local interconnect shape or the contact bar shape) into four different regions: (1) a first region, which is at the bottom of the first conductive shape 213(a) and which always has a point of connectivity with the diffusion boundary shape 220; (2) a second region at the top of the first conductive shape and defined by the diffusion boundary shape; (3) a third region at one end of the first conductive shape 213(a) and entirely outside the diffusion boundary shape; and (4) a fourth region at the opposite end of the first conductive shape 213(a) and also entirely outside the diffusion boundary shape. The model selector 123 can further apply pre-established connectivity-based rules to determine which specific connectivity-based resistance model in the model library 112 to select to represent the first conductive shape 213(a). The pre-established connectivity-based rules can specifically dictate the number of nodes (e.g., ranging from 2 to 4) and the number of resistive elements (e.g., ranging from 1-3) to be incorporated into the condensed resistance model for the first conductive shape 213(a) and can do so depending upon a first number, which is defined herein as the number between 0 and 2 of second conductive shapes that are directly connected to the first conductive shape entirely within the third and/or fourth regions (i.e., at one or both ends) and, thereby entirely outside the diffusion boundary shape, and further depending upon a second number, which is defined herein as the number between 0 and at least 1 of second conductive shapes that are directly connected to the first conductive shape at least partially in the second region (i.e., at the top) and, thereby at least partially within the diffusion boundary shape.

For example, FIGS. 4A, 5A, 6A, 7A, 8A, and 9A illustrate partial design layouts showing different configurations for the finFET 200A of FIG. 2A, wherein the connectivity of the first conductive shape 213(a) to zero or more second conductive shapes in the second, third and fourth regions, described above, varies between the design layouts. FIGS. 4B, 5B, 6B, 7B, 8B, and 9B illustrate exemplary condensed resistance models selected by the model selector 123 from the model library 112 for the first conductive shape 213(a) in each of these different configurations.

Figure 4A:
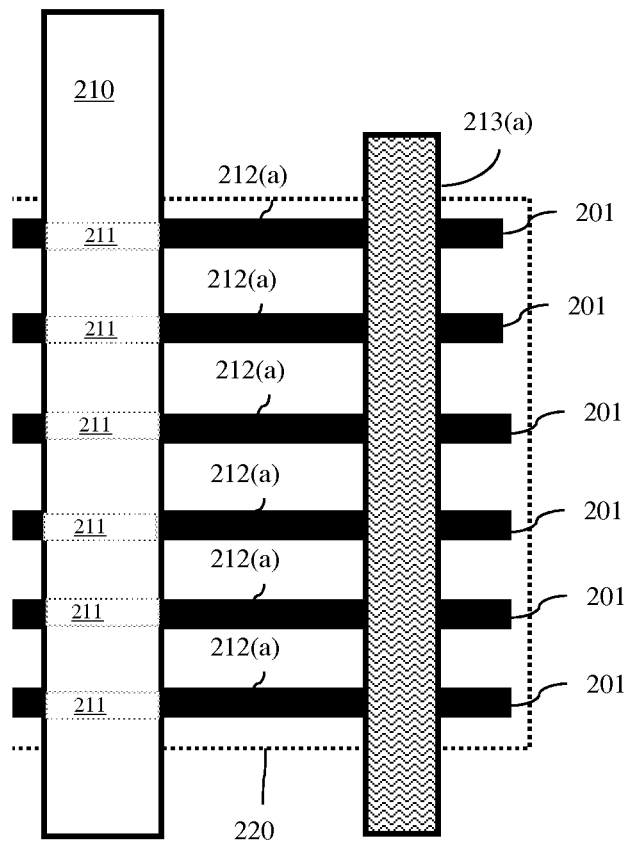
FIG. 4A is a top view diagram illustrating a first conductive shape on a diffusion boundary shape and having no other points of connectivity.
Figure 4B:
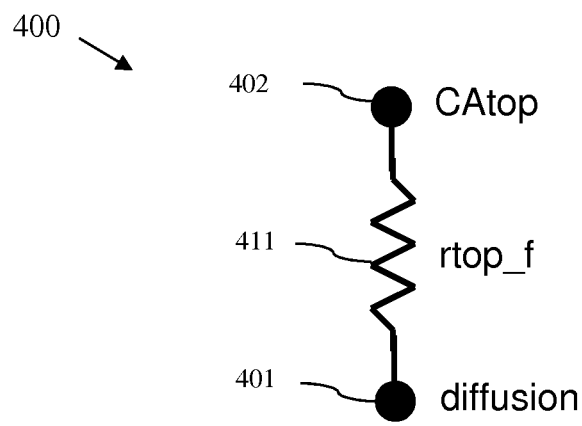
FIG. 4B is a schematic diagram illustrating an exemplary connectivity-based condensed resistance model corresponding to the first conductive shape in FIG. 4A.

More specifically, an analysis, by the layout analyzer 121, of the shapes in the design layout shown in FIG. 4A, would identify a diffusion boundary shape 220 of the finFET 200A, a first conductive shape 213(a) (i.e., an internal local interconnect shape) on the diffusion boundary shape 220 and no second conductive shapes (e.g., no via shapes, no via bar shapes, external local interconnect shapes or other conductive shapes) connected to the first conductive shape 213(a) at all. In this case, since there are no second conductive shapes in contact with the first conductive shape 213(a) at all (i.e., since the first and second numbers are both zero), the pre-established connectivity-based rules, as applied by the model selector 123, can provide for the selection from the model library 112 of a specific condensed resistance model 400 comprising only two nodes 401-402, which represent the first and second regions (i.e., the bottom and top, respectively) of the first conductive shape 213(a) and a single resistive element 411 extending between the two nodes 401-402, as shown in FIG. 4B. It should be noted that, when the condensed resistance model 400 is subsequently combined with other component-level parasitic resistance and capacitance elements, a capacitive element (not shown) representing the capacitance between the first conductive shape 213(a) and an adjacent gate shape 210 could be connected to the top node 402.

Figure 5A:
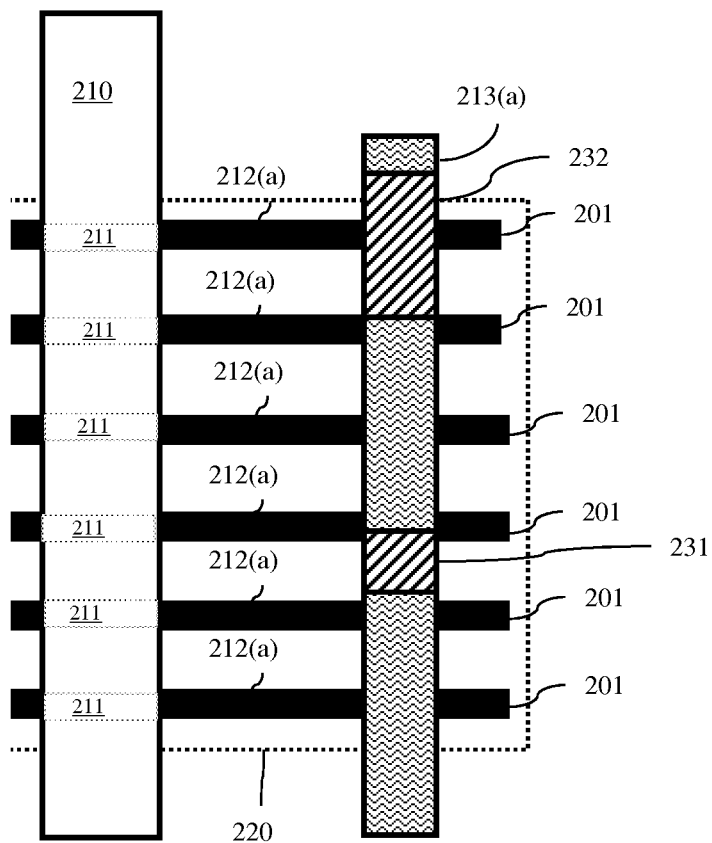
FIG. 5A is a top view diagram illustrating a first conductive shape on a diffusion boundary shape with points of connectivity to second conductive shapes within the diffusion boundary shape only.
Figure 5B:
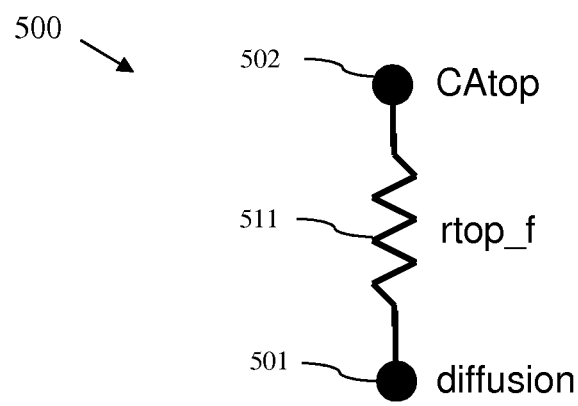
FIG. 5B is a schematic diagram illustrating an exemplary connectivity-based 2-node condensed resistance model corresponding to the first conductive shape in FIG. 5A.

An analysis, by the layout analyzer 121, of the shapes in the design layout shown in FIG. 5A, would identify a diffusion boundary shape 220 of a finFET 200A, a first conductive shape 213(a) (e.g., an internal local interconnect shape) on the diffusion boundary shape 220 and two second conductive shapes (e.g., a via shape 231 and a via bar shape 232) connected to the first conductive shape 213(a). The layout analyzer 121 would further identify that the corresponding interface locations between each of these second conductive shapes 231 and 232 and the first conductive shape 213(a) relative to the diffusion boundary shape 220. Specifically, the layout analyzer 121 would identify the corresponding interface location between the second conductive shape 231 and the first conductive shape 213(a) as being contained entirely within the second region and, thereby contained entirely within the diffusion boundary shape 220. The layout analyzer 121 would further identify the corresponding interface location between the second conductive shape 232 and the first conductive shape 213(a) as being partially contained within the second region and, thereby partially contained within the diffusion boundary shape 220. In this case, since there are no second conductive shapes in contact with the first conductive shape 213(a) entirely outside the diffusion boundary shape 220 (i.e., since the first number is zero) and since there are two second conductive shapes at least partially in contact with the first conductive shape 213(a) within the diffusion boundary shape 220 (i.e., since the second number is at least one), the pre-established connectivity-based rules, as applied by the model selector 123, can provide for the selection from the model library 112 of a specific condensed resistance model 500 comprising only two nodes 501-502, which represent the first and second regions (i.e., the bottom and top, respectively) of the first conductive shape 213(a) and a single resistive element 511 extending between the two nodes 501-502, as shown in FIG. 5B. It should be noted that, when the condensed resistance model 500 is subsequently combined with other component-level parasitic resistance and capacitance elements, a capacitive element (not shown) representing the capacitance between the first conductive shape 213(a) and an adjacent gate shape 210 as well as additional resistive elements (not shown) representative of the second conductive shapes 231-232 could each be connected to the node 502.

Figure 6A:
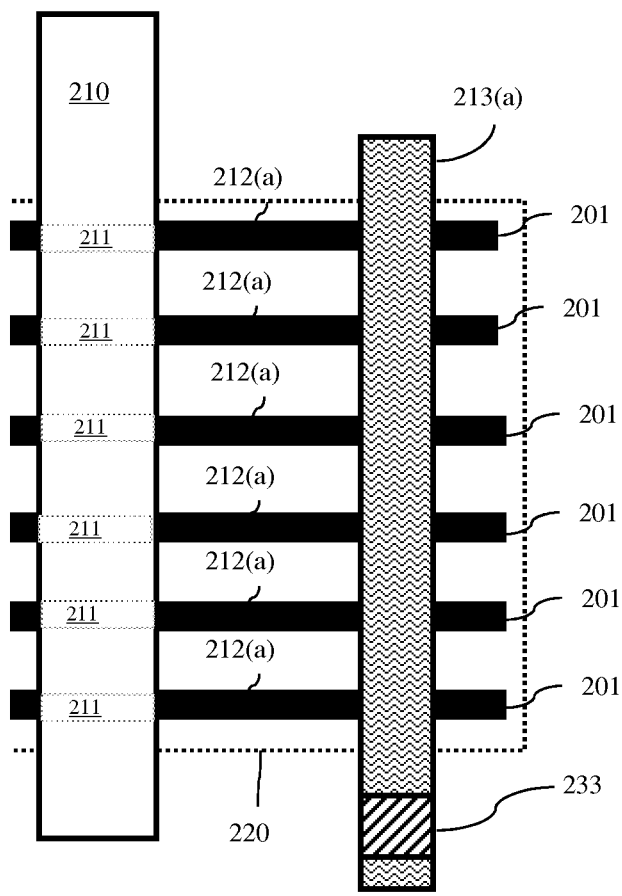
FIG. 6A is a top view diagram illustrating a first conductive shape on a diffusion boundary shape with a single point of connectivity to a second conductive shape outside the diffusion boundary shape.
Figure 6B:
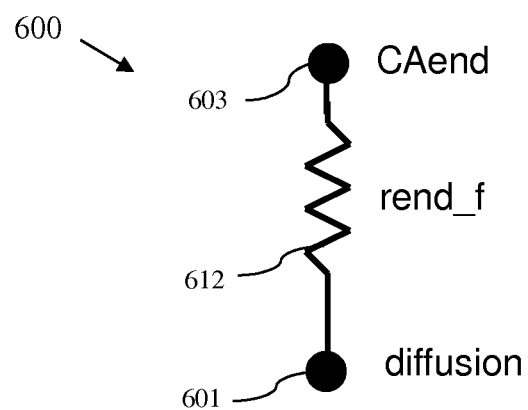
FIG. 6B is a schematic diagram illustrating an exemplary 2-node connectivity-based condensed resistance model corresponding to the first conductive shape in FIG. 6A.

An analysis, by the layout analyzer 121, of the shapes in the design layout shown in FIG. 6A, would identify a diffusion boundary shape 220 of the finFET 200A, a first conductive shape 213(a) (e.g., an internal local interconnect shape) on the diffusion boundary shape 220 and only one second conductive shape (e.g., a via shape 233) connected to the first conductive shape 213(a). The layout analyzer 121 would further identify the corresponding interface location between the second conductive shape 233 and the first conductive shape 213(a) relative to the diffusion boundary shape 220. Specifically, the layout analyzer 121 would identify the corresponding interface location between the second conductive shape 223 and the first conductive shape 213(a) as being contained entirely in the third region of the first conductive shape 213(a) (i.e., at one end of the first conductive shape 213(a)) and, thereby entirely outside the diffusion boundary shape 220. In this case, since there is one second conductive shape 233 in contact with the first conductive shape 213(a) outside the diffusion boundary shape 220 (i.e., since the first number is one) and since there are no second conductive shapes in contact with the first conductive shape 213 at least partially within the diffusion boundary shape 220 (i.e., since the second number is zero), the pre-established connectivity-based rules, as applied by the model selector 123, can provide for the selection from the model library 112 of a specific condensed resistance model 600 again comprising only two nodes 601 and 603, which represent the bottom of the first conductive shape 213(a) and one end of the first conductive shape 213(a), respectively, and a single resistive element 612 extending between the two nodes 603, as shown in FIG. 6B. It should be noted that, when the condensed resistance model 600 is subsequently combined with other component-level parasitic resistance and capacitance elements, a capacitive element (not shown) representing the capacitance between the first conductive shape 213(a) and an adjacent gate shape 210 as well as an additional resistive element (not shown) representative of the second conductive shape 233 could be connected to the end node 603.

Figure 7A:
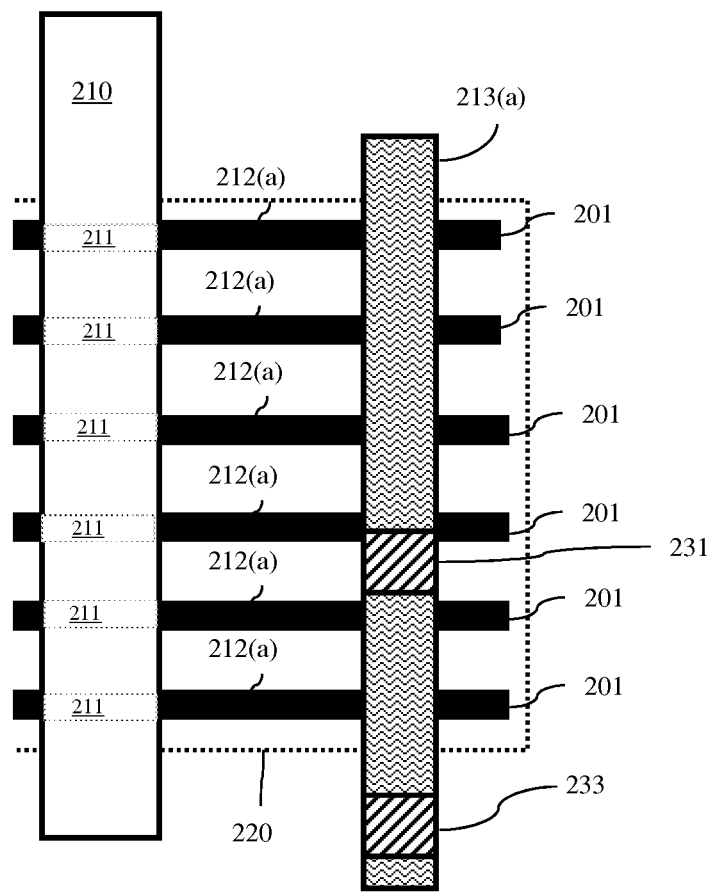
FIG. 7A is a top view diagram illustrating a first conductive shape on a diffusion boundary shape with points of connectivity to second conductive shapes both inside and outside the diffusion boundary shape.
Figure 7B:
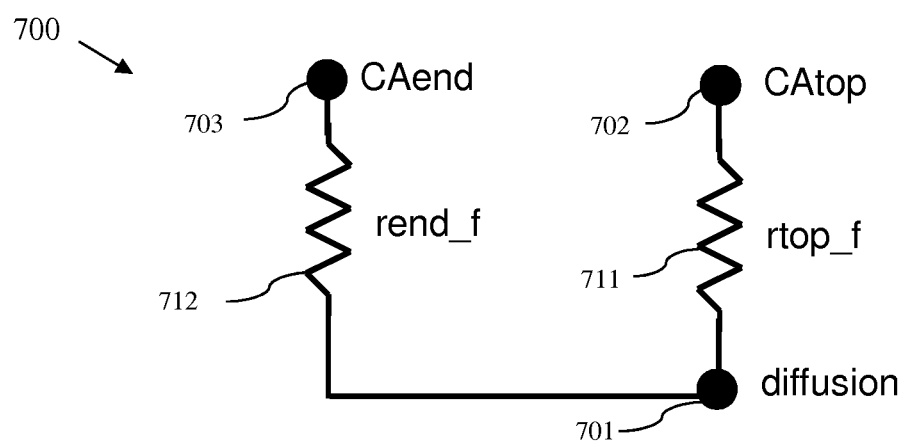
FIG. 7B is a schematic diagram illustrating an exemplary 2-node connectivity-based condensed resistance model corresponding to the first conductive shape in FIG. 7A.

An analysis, by the layout analyzer 121, of the shapes in the design layout shown in FIG. 7A, would identify a diffusion boundary shape 220 of a finFET 200A, a first conductive shape 213(a) (e.g., an internal local interconnect shape) on the diffusion boundary shape 220 and two second conductive shapes (e.g., a via shape 231 and a via shape 233) connected to the first conductive shape 213(a). The layout analyzer 121 would further identify the corresponding interface locations between the second conductive shapes 231 and 233 and the first conductive shape 213(a) relative to the diffusion boundary shape 220. Specifically, the layout analyzer 121 would identify the corresponding interface location between the second conductive shape 231 and the first conductive shape 213(a) as being contained entirely within the second region of the first conductive shape 213(a) and, thereby contained entirely within the diffusion boundary shape 220. The layout analyzer 121 would further identify the corresponding interface location between the second conductive shape 233 and the first conductive shape 213(a) as being contained entirely within the third region of the first conductive shape 213(a) (i.e., at one end of the first conductive shape 213(a)) and, thereby entirely outside the diffusion boundary shape 220. In this case, since there is one second conductive shape 233 in contact with the first conductive shape 213(a) outside the diffusion boundary shape 220 (i.e., since the first number is one) and since there is one second conductive shape 231 in contact with the first conductive shape 213(a) at least partially within the diffusion boundary shape 220 (i.e., since the second number is at least one), the pre-established connectivity-based rules, as applied by the model selector 123, can provide for the selection from the model library 112 of a specific condensed resistance model 700 comprising only three nodes 701-703, which represent the bottom node, top node and one end node, respectively, of the first conductive shape 213(a), and only two resistive elements (e.g., a first resistive element 711 extending between the bottom node 701 and top node 702 and a second resistive element 712 extending between the bottom node 701 and the end node 703), as shown in FIG. 7B. It should be noted that, when the condensed resistance model 700 is subsequently combined with other component-level parasitic resistance and capacitance elements, capacitive elements (not shown) representing the capacitance between the first conductive shape 213(a) and an adjacent gate shape 210 could be connected to both the top node 702 and the end node 703. Furthermore, additional resistive elements (not shown) representative of the second conductive shapes 231 and 232 can be connected to the top node 702 and end node 703, respectively.

Figure 8A:
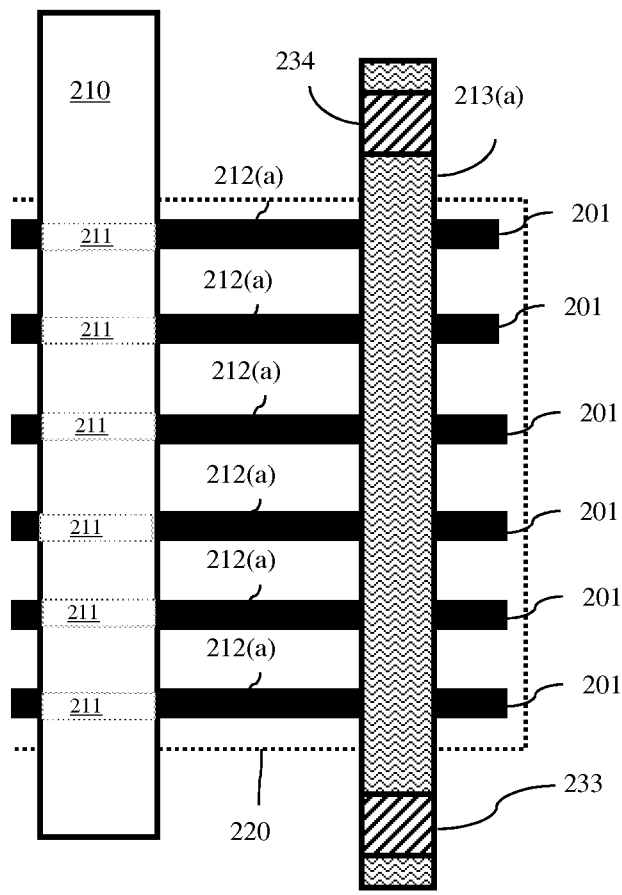
FIG. 8A is a top view diagram illustrating a first conductive shape on a diffusion boundary shape with multiple points of connectivity to second conductive shapes outside the diffusion boundary shape at opposite ends of the first conductive shape.
Figure 8B:
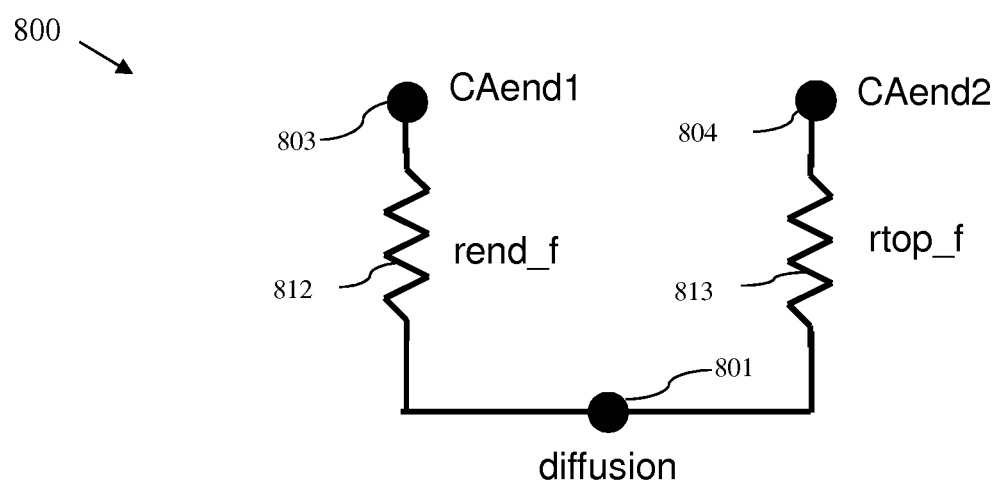
FIG. 8B is a schematic diagram illustrating an exemplary 3-node connectivity-based condensed resistance model corresponding to the first conductive shape in FIG. 8A.

An analysis, by the layout analyzer 121, of the shapes in the design layout shown in FIG. 8A, would identify a diffusion boundary shape 220 of a finFET 200A, a first conductive shape 213(a) (e.g., an internal local interconnect shape) on the diffusion boundary shape 220 and two second conductive shapes (e.g., a via shape 233 and a via shape 234) connected to the first conductive shape 213(a). The layout analyzer 121 would further identify the corresponding interface locations between the second conductive shapes 233 and 234 and the first conductive shape 213(a) relative to the diffusion boundary shape 220. Specifically, the layout analyzer 121 would further identify the corresponding interface locations between the second conductive shapes 233 and 234 and the first conductive shape 213(a) as being contained entirely within the third and fourth regions, respectively, of the first conductive shape 213(a) and, thereby outside the diffusion boundary shape 220. In this case, since there are two second conductive shapes 233 and 234 in contact with the first conductive shape 213(a) outside the diffusion boundary shape 220 (i.e., since the first number is two) and since there are no second conductive shapes in contact with the first conductive shape 213(a) at least partially within the diffusion boundary shape 220 (i.e., since the second number is zero), the pre-established connectivity-based rules, as applied by the model selector 123, can provide for the selection from the model library 112 of a specific condensed resistance model 800 again comprising only three nodes 801, 803 and 804, which represent the bottom and each of the ends, respectively, of the first conductive shape 213(a), and two resistive elements 812 and 813, which extend between the bottom node 801 and each of the end nodes 802 and 803, respectively, as shown in FIG. 8B. It should be noted that, when the condensed resistance model 800 is subsequently combined with other component-level parasitic resistance and capacitance elements, capacitive elements (not shown) representing the capacitance between the first conductive shape 213(a) and an adjacent gate shape 210 could be connected to both of the end nodes 803 and 804. Furthermore, additional resistive elements (not shown) representative of the second conductive shapes 233 and 234 can be connected to the end nodes 803 and 804, respectively.

Figure 9A:
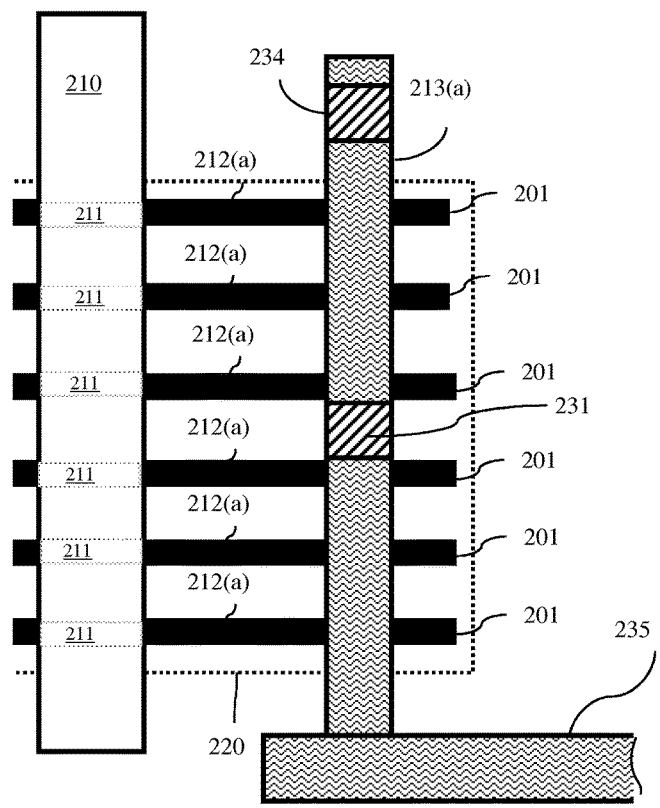
FIG. 9A is a top view diagram illustrating a first conductive shape on a diffusion boundary shape with multiple point of connectivity to second conductive shapes both inside the diffusion boundary shape and outside the diffusion boundary shape at opposite ends of the first conductive shape.
Figure 9B:
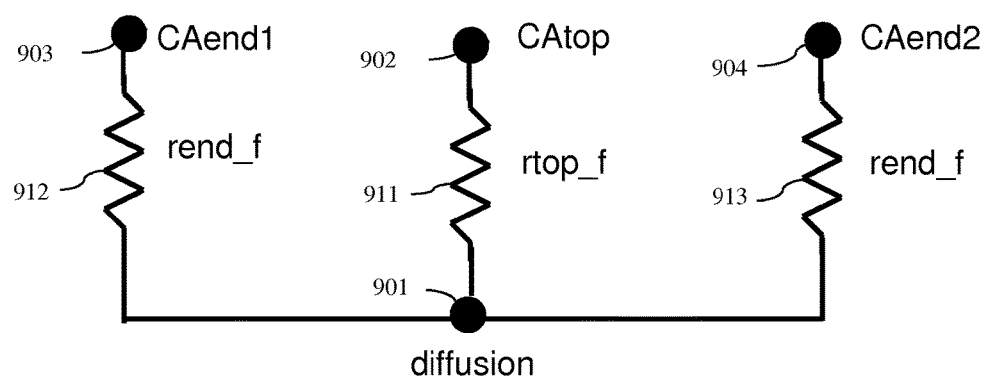
FIG. 9B is a schematic diagram illustrating an exemplary 4-node connectivity-based condensed resistance model corresponding to the first conductive shape in FIG. 9A.

An analysis, by the layout analyzer 121, of the shapes in the design layout shown in FIG. 9A, would identify a diffusion boundary shape 220 of finFET 200A, a first conductive shape 213(a) (e.g., an internal local interconnect shape) on the diffusion boundary shape 220 and three second conductive shapes (e.g., a via shape 231, a via shape 234 and an external local interconnect shape 235) connected to the first conductive shape 213(a). The layout analyzer 121 would further identify the corresponding interface locations between the second conductive shapes 231, 234 and 235 and the first conductive shape 213(a) relative to the diffusion boundary shape 220. Specifically, the layout analyzer 121 would further identify the corresponding interface location between the second conductive shape 231 and the first conductive shape 213(a) as being contained entirely within the second region of the first conductive shape and, thereby contained entirely within the diffusion boundary shape 220. The layout analyzer 121 would further identify the second conductive shapes 235 and 234 as being contained entirely in the third and fourth regions of the first conductive shape 213(a) and, thereby entirely outside the diffusion boundary shape 220. In this case, since there are two second conductive shape 233 and 235 in contact with the first conductive shape 213(a) outside the diffusion boundary shape 220 at each of the opposing ends of the first conductive shape 213(a) (i.e., since the first number is two) and since there is another second conductive shape 231 in contact with the first conductive shape 213(a) at least partially within the diffusion boundary shape 220 (i.e., since the second number is at least one), the pre-established connectivity-based rules, as applied by the model selector 123, can provide for the selection from the model library 112 of a specific condensed resistance model 900 comprising four nodes 901-904, which represent the bottom, top and each of the ends, respectively, of the first conductive shape 213(a) and three resistive elements 911-912 extending between the bottom node 901 and the top and end nodes 902-904, respectively, as shown in FIG. 9B. It should be noted that, when the condensed resistance model 900 is subsequently combined with other component-level parasitic resistance and capacitance elements, capacitive elements (not shown) representing the capacitance between the first conductive shape 213(a) and an adjacent gate shape 210 could be connected to each of the nodes 902-904. Furthermore, additional resistive elements (not shown) representative of the second conductive shapes 231, 235 and 234 can be connected to the top node 902, end node 903 and opposite end node 904.

Thus, when the first conductive shape 213(a) has any of the following, the specific condensed resistance model selected will only have two nodes with a single resistive element connecting those two nodes (e.g., as in the condensed resistance models 400-600): (1) no points of connectivity with a second conductive shape (e.g., when the first number and second number are both zero, as in FIG. 4A); (2) point(s) of connectivity with second conductive shape(s) that at least partially overlap the diffusion boundary shape 220 only (e.g., when the first number is zero and the second number is at least one, as in FIG. 5A); or (3) point(s) of connectivity with second conductive shape(s) that are entirely outside the diffusion boundary shape 220 at one end (e.g., when the first number is one and the second number is zero, as in FIG. 6A). When the first conductive shape 213(a) has any of the following, the specific condensed resistance model selected will only have three nodes with two resistive elements connecting one node with the other two nodes (e.g., as in the condensed resistance models 700-800): (1) point(s) of connectivity with second conductive shape(s) that are entirely outside the diffusion boundary shape 220 at one end and point(s) of connectivity with other second conductive shape(s) that at least partially overlap the diffusion boundary shape 220 (e.g., when the first number is one and the second number is at least one, as in FIG. 7A); or (2) points of connectivity with second conductive shapes that are entirely outside the diffusion boundary shape 220 at both ends (e.g., when the first number is two and the second number is one, as in FIG. 8A). Finally, when the first conductive shape 213(a) has points of connectivity with second conductive shapes entirely outside the diffusion boundary shape 220 at both ends and also at least partially overlapping the diffusion boundary shape 220 (e.g., when the first number is two and the second number is at least one, as in FIG. 9A), the specific condensed resistance model selected will have four nodes with three resistive elements connecting one node with each of the other three nodes (e.g., as in the condensed condensed netlist 900).

Figure 3:
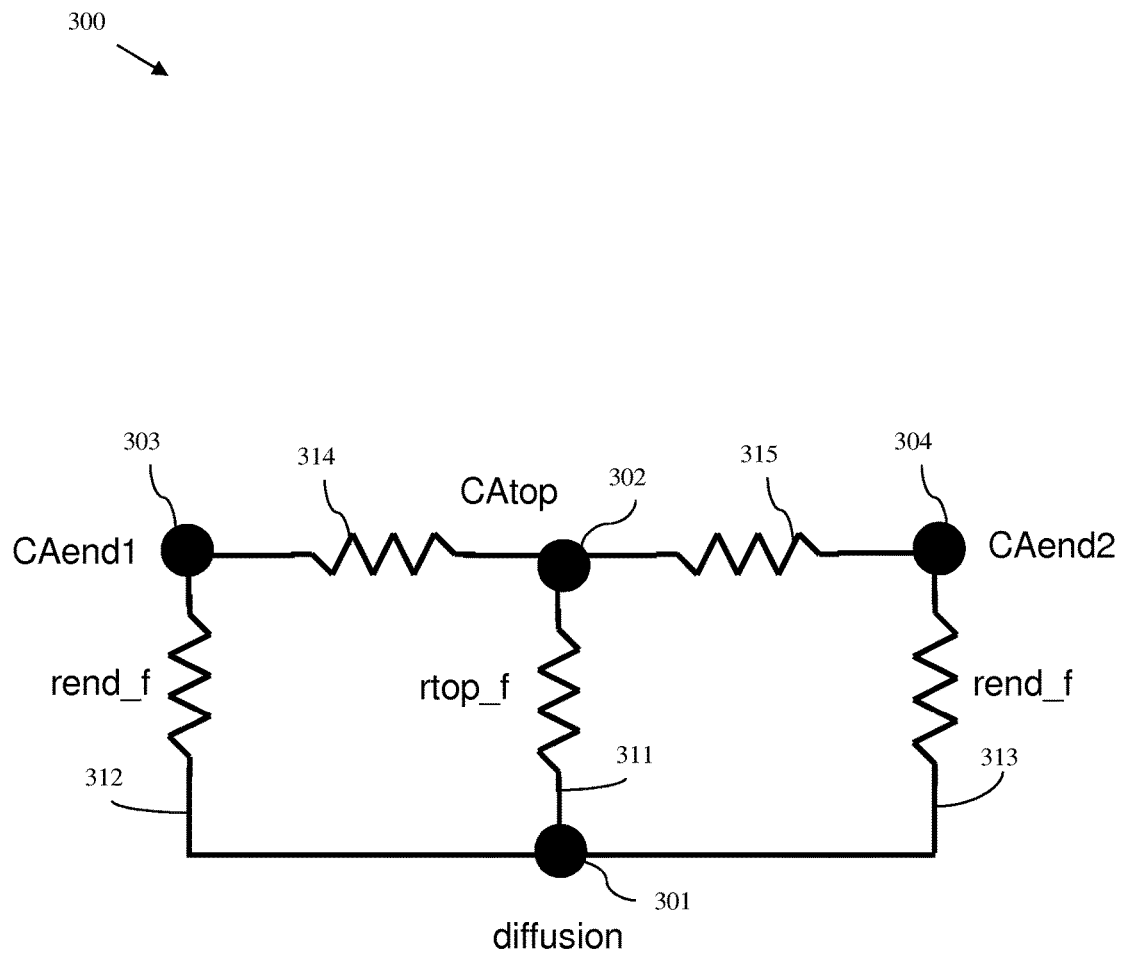
FIG. 3 is a schematic diagram illustrating a 4-node full resistance model corresponding to the MOSFET in FIG. 2A (or the MOSFET in FIG. 2B)

In any case, in all of these condensed resistance models 400, 500, 600, 700, 800, and 900 for the first conductive shape 213(a), as shown in FIGS. 4B, 5B, 6B, 7B, 8B, and 9B, respectively, there are a lesser number of nodes and/or a lesser number of resistive elements (i.e., a lesser number of resistors) than in the full resistance model 300 for that same shape, as shown in FIG. 3. Specifically, in all of the condensed resistance models 400-900, there are a lesser number of resistive elements than the five resistive elements 311-315 seen in the full resistance model 300. Furthermore, in the condensed resistance models 400-800, there are a lesser number of nodes than the four nodes 301-304 seen in the full resistance model 300 of FIG. 3. Thus, each of the various possible condensed resistance model 400, 500, 600, 700, 800, and 900 that could be selected has a unique number of nodes and resistive elements consistent with its number of regions of connectivity.

Figure 10:
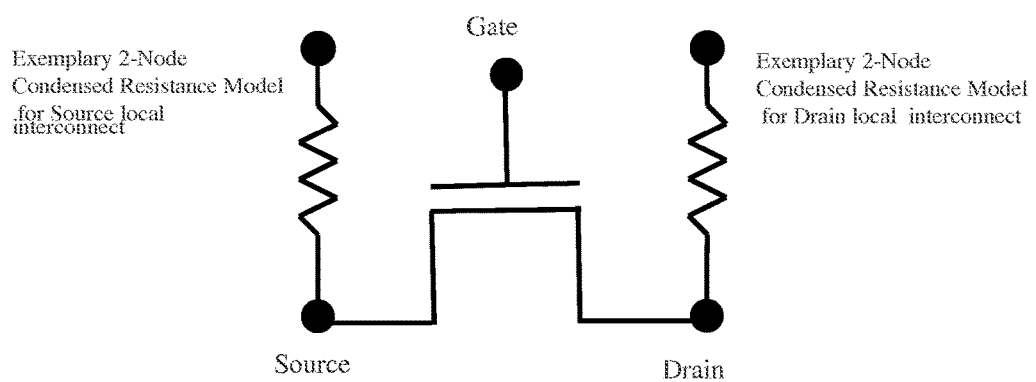
FIG. 10 is a schematic diagram illustrating exemplary 2-node condensed resistance models of FIG. 4B, 5B or 6B on source/drain regions, respectively, of a MOSFET.

In the modeling system 100, the netlist extractor 140 can be in communication with the model selector 123 (or in the case of an LVS tool 120 comprising a model selector 123, in communication with the LVS tool 120) and can use the selected condensed resistance model to generate a corresponding netlist for the first conductive shape. That is, the netlist extractor 140 can use the specific condensed resistance model selected for the first conductive shape 213(a) to define a netlist for that first conductive shape 213(a). This netlist can be defined, for example, in a SPICE language suitable for input into the SPICE simulator 150. Techniques for using a resistance model to define a netlist in SPICE language are well known in the art and thus, the details are omitted from this specification in order to allow the reader to focus on the salient aspects of the disclosed system 100. This netlist for the first conductive shape 213(a) can then be combined by the netlist extractor 140 with other component-level netlists extracted from the design layout 111 (i.e., with netlists for all other components, including the FET 200A itself (e.g., see exemplary 2-node condensed resistance models of FIG. 4B, 5B or 6B on source/drain regions, respectively, of FET 200A, as illustrated in FIG. 10), other active components, passive components and interconnects, in the integrated circuit in order to generate a combined netlist for the entire integrated circuit.

In the modeling system 100, the simulator 150 (e.g., a SPICE simulator) can first parse (i.e., read in) the combined netlist that is generated by the netlist extractor 140 and can then simulate the performance of the integrated circuit using the combined netlist that contains the condensed netlist of the first conductive shape 213(a). Techniques for simulating the performance of an integrated circuit based on a combined netlist are well known in the art and, thus, the details are omitted from this specification in order to allow the reader to focus on the salient aspects of the disclosed system. However, it should be understood that, because the resistance model for the first conductive shape 213(a) as selected by the model selector 123 is a condensed resistance model, the netlist for the first conductive shape 213(a) as generated by the netlist extractor 140 will similarly be a condensed netlist as compared to a full netlist for the same shape. As a result, in the modeling system 100 the number of simulation runs required by the simulator 150 to simulate the performance of the integrated circuit will be reduced and, thus, so will the overall simulation time.

Those skilled in the art will recognize that the results of integrated circuit performance simulation can be used to generate a performance model for the integrated circuit, as designed, and the performance model can be used as a basis for adjusting the design layout 111, if necessary (e.g., if performance specifications are not met). Once the design layout 111 is finalized, it can be used for integrated circuit test and/or manufacture. In other words, the above-described integrated circuit performance modeling system 100 can be readily incorporated into a standard design flow used for integrated circuit design, simulation, test, layout, and manufacture.

Also disclosed herein is an integrated circuit performance modeling method that can, for example, be implemented using the integrated circuit performance modeling system 100 of FIG. 1. It should be understood that the integrated circuit performance modeling method disclosed herein pertains specifically to an integrated circuit that comprises at least one semiconductor device with at least one conductive structure (e.g., an internal local interconnect, a contact bar or other conductive structure) on a diffusion region. Exemplary semiconductor devices with conductive structure(s) on a diffusion region are the metal oxide semiconductor (MOS) field effect transistors (FETs) 200A and 200B, illustrated in FIGS. 2A and 2B and described in detail above. Other exemplary semiconductor devices that may have conductive structure(s) on a diffusion region include, but are not limited to, MOS capacitors and diodes. For purposes of illustration, the modeling method disclosed herein will be described in greater detail below and illustrated in the Figures with respect to the finFET 200A of FIG. 2A.

As discussed in detail above, FIG. 3 is an illustration of an exemplary full resistance model for a conductive structure 213(a) (e.g., an internal local interconnect of the FET 200A of FIG. 2A or a contact bar of the FET 200B of FIG. 2B) and this full resistance model 300 comprises four nodes 301-304 representative of four regions of the first conductive structure 213(a) (e.g., bottom, top, and opposing ends) that can be points of connectivity and five resistive elements 311-315 (i.e., resistors) representative of the resistance values between the four nodes 301-304. In the modeling method disclosed herein, the conductive structure's connectivity to other conductive structures is identified and a specific condensed resistance model (i.e., a shortened or smaller resistance model), which has a lesser number of nodes and/or a lesser number of resistive elements (i.e., a lesser number of resistors) than the full resistance model 300 is selected from a model library based on that connectivity. By reducing the number of nodes and/or resistive elements in the resistance model for the conductive structure and, thereby in the netlist for the conductive structure, which is generated based on that resistance model, this modeling method reduces the number of simulation runs and the overall time required for integrated circuit performance modeling.

Figure 11:
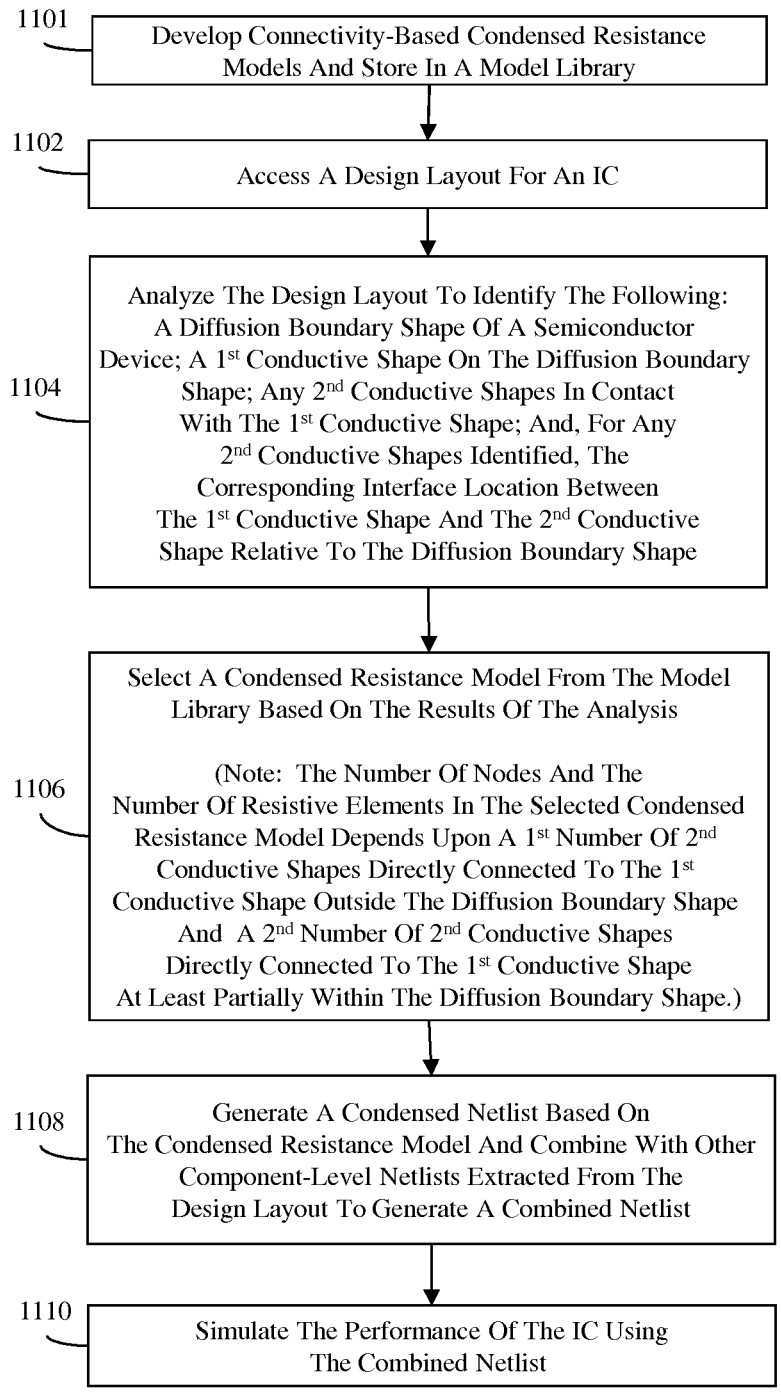
FIG. 11 is a flow diagram illustrating an integrated circuit modeling method.

More particularly, referring to the flow diagram of FIG. 11 in combination with the integrated circuit modeling system diagram of FIG. 1, the method can comprise accessing an integrated circuit design layout 111, which is stored in a memory 110 (1102). This design layout 111 can comprise an object-based design layout that provides a geometric representation of the design of a specific integrated circuit. In an object-based design layout specific features (i.e., objects) of each of the various integrated circuit components can be identified by overlapping geometric shapes (also referred to herein as seed shapes) in, for example, different colors or patterns. For a semiconductor device, such as a MOSFET, these overlapping geometric shapes can include, but are not limited to, a diffusion boundary shape, a gate shape, first conductive shape(s) (e.g., internal local interconnect shape(s), contact bar shape(s), or other conductive shape(s)) that are on the diffusion boundary shape, and any second conductive shape(s) (i.e., via shape(s), via bar shape(s), external local interconnect shape(s), or other conductive shape(s)) that are directly connected to (i.e., immediately adjacent to, in direct physical contact with, etc.) the first conductive shape(s).

The method can comprise analyzing the design layout 111 and, particularly, sorting the various geometric shapes (i.e., seed shapes) within design layout 111 in order to identify one of the semiconductor devices at issue (i.e., a semiconductor device having a diffusion region and a conductive structure on and in contact with that diffusion region) (1104). Specifically, this analysis process can comprise identifying a diffusion boundary shape of a semiconductor device and a first conductive shape (e.g., an internal local interconnect shape, a contact bar shape, or other conductive shape) on and in contact with the diffusion boundary shape. When such a first conductive shape is identified, any second conductive shapes (e.g., via shapes, via bar shapes, external local interconnect shapes or other conductive shapes) that are directly connected to (i.e., immediately adjacent to, in direct physical contact with, etc.) the first conductive shape can be identified. If any second conductive shapes are identified as being directly connected to the first conductive shape, then, for each second conductive shape, a corresponding interface location (i.e., the location of the point of connectivity, also referred to herein as the point of contact) between the second conductive shape and the first conductive shape relative to the diffusion boundary shape (i.e., entirely outside the diffusion boundary shape or at least partially within the diffusion boundary shape) can be identified.

The method can further comprise, prior to accessing the design layout 111 and performing the analysis described above at processes 1102-1104, generating (i.e., developing) a plurality of connectivity-based condensed resistance models for conductive structures (e.g., for internal local interconnects, contact bars or other conductive structures) and storing those connectivity-based condensed resistance models in a model library 112 in a memory 110 (1101). These connectivity-based condensed resistance models for conductive structures can vary based on the conductive structure's connectivity to any other conductive structure's and, particularly, can vary as a function of whether the conductive structure is electrically connected to and in direct contact with any other conductive structures and, if so, where that connection/contact occurs relative to the diffusion region.

The method can further comprise selecting, from the model library 112, a specific condensed resistance model for the first conductive shape based on the results of the above-described analysis (1106). Specifically, a specific condensed resistance model for the first conductive shape can be selected from the model library 112 by applying pre-established connectivity-based rules. The pre-established connectivity-based rules can dictate the number of nodes and the number of resistive elements between the nodes in the specific condensed resistance model to be selected based on the following: (1) the presence or absence of any second conductive shapes directly connected to the first conductive shape; and (2) when there is at least one second conductive shape connected to the first conductive shape, whether the interface location(s) between the second conductive shape(s) and the first conductive shape is/are entirely outside the diffusion boundary shape at one or both ends of the first conductive shape and/or whether those interface location(s) is/are at least partially within the diffusion boundary shape at the top of the first conductive shape.

This selection will process will be described in greater detail with respect to the finFET 200A of FIG. 2A, which comprises a first conductive shape 213(a) (e.g., an internal local interconnect shape) on source/drain regions 212(a) of semiconductor fins 201). In this case, the first conductive shape 213(a) can be partitioned into four different regions: (1) a first region, which is at the bottom of the first conductive shape 213(a) and which always has a point of connectivity with the diffusion boundary shape 220; (2) a second region at the top of the first conductive shape and defined by the diffusion boundary shape; (3) a third region at one end of the first conductive shape 213(a) and entirely outside the diffusion boundary shape; and (4) a fourth region at the opposite end of the first conductive shape 213(a) and also entirely outside the diffusion boundary shape. The pre-established connectivity-based rules for selecting the specific condensed resistance model from the model library 112 can dictate the number of nodes (e.g., ranging from 2 to 4) and the number of resistive elements (e.g., ranging from 1-3) required for the selected condensed resistance model, depending upon a first number, which is defined herein as the number between 0 and 2 of second conductive shapes that are directly connected to the first conductive shape entirely within the third and/or fourth regions (i.e., at one or both ends) and, thereby entirely outside the diffusion boundary shape, and further depending upon a second number, which is defined herein as the number between 0 and at least 1 of second conductive shapes that are directly connected to the first conductive shape at least partially in the second region (i.e., at the top) and, thereby at least partially within the diffusion boundary shape.

For example, FIGS. 4A, 5A, 6A, 7A, 8A, and 9A illustrate partial design layouts showing different configurations for the finFET 200A of FIG. 2A, wherein the connectivity of the first conductive shape 213(a) to zero or more second conductive shapes in the second, third and fourth regions, described above, varies between the design layouts. FIGS. 4B, 5B, 6B, 7B, 8B, and 9B illustrate exemplary condensed resistance models that can be selected by the model selector 123 for the first conductive shape 213(a) for each of these different configurations, respectively. More specifically, as described in greater detail above with regard to the modeling system 100, when the first conductive shape 213(a) has any of the following, the specific condensed resistance model selected from the model library 112 at process 1106 should only have two nodes with a single resistive element connecting those two nodes (e.g., as in the condensed resistance models 400 of FIG. 4B, 500 of FIG. 5B and 600 of FIG. 6B): (1) no points of connectivity with a second conductive shape (e.g., when the first number and second number are both zero, as in FIG. 4A); (2) point(s) of connectivity with second conductive shape(s) that at least partially overlap the diffusion boundary shape 220 only (e.g., when the first number is zero and the second number is at least one, as in FIG. 5A); or (3) point(s) of connectivity with second conductive shape(s) that are entirely outside the diffusion boundary shape 220 at one end (e.g., when the first number is one and the second number is zero, as in FIG. 6A). When the first conductive shape 213(a) has any of the following, the specific condensed resistance model selected from the model library 112 at process 1106 should only have three nodes with two resistive elements connecting one node with the other two nodes (e.g., as in the condensed resistance models 700 of FIG. 7B and 800 of FIG. 8B): (1) point(s) of connectivity with second conductive shape(s) that are entirely outside the diffusion boundary shape 220 at one end and point(s) of connectivity with other second conductive shape(s) that at least partially overlap the diffusion boundary shape 220 (e.g., when the first number is one and the second number is at least one, as in FIG. 7A); or (2) points of connectivity with second conductive shapes that are entirely outside the diffusion boundary shape 220 at both ends (e.g., when the first number is two and the second number is one, as in FIG. 8A). Finally, when the first conductive shape 213(a) has points of connectivity with second conductive shapes entirely outside the diffusion boundary shape 220 at both ends and also at least partially overlapping the diffusion boundary shape 220 (e.g., when the first number is two and the second number is at least one, as in FIG. 9A), the specific condensed resistance model selected from the model library 112 at process 1106 should have four nodes with three resistive elements connecting one node with each of the other three nodes (e.g., as in the condensed resistance model 900 of FIG. 9B). It should be noted that in all of the condensed resistance models 400, 500, 600, 700, 800, and 900 for the first conductive shape 213(a), as shown in FIGS. 4B, 5B, 6B, 7B, 8B, and 9B, respectively, there are a lesser number of nodes and/or a lesser number of resistive elements (i.e., a lesser number of resistors) than in the full resistance model 300 for that same shape, as shown in FIG. 3. Specifically, in all of the condensed resistance models 400-900 that could be selected, there are a lesser number of resistive elements than the five resistive elements 311-315 seen in the full resistance model 300. Furthermore, in the condensed resistance models 400-800, there are a lesser number of nodes than the four nodes 301-304 seen in the full resistance model 300 of FIG. 3. Thus, each condensed resistance model 400, 500, 600, 700, 800, and 900, which is stored in the model library 112 and available for selection, has a unique number of nodes and resistive elements consistent with its number of regions of connectivity.

The method can further comprise generating a netlist for the first conductive shape 213(a) from the specific condensed resistance model previously selected at process 1106 (1108). That is, the specific condensed resistance model for the first conductive shape 213(a) selected at process 1106 can be used to define a netlist for that first conductive shape 213(a). This netlist can be defined, for example, in a SPICE language, suitable for SPICE simulation. Techniques for using a resistance model to define a netlist in a SPICE language are well known in the art and thus, the details are omitted from this specification in order to allow the reader to focus on the salient aspects of the disclosed system 100.

The method can further comprise combining this netlist for the first conductive shape 213(a) with other component-level netlists extracted from the design layout 111 (i.e., with netlists for all other components, including the FET 200A itself (e.g., see exemplary 2-node condensed resistance models of FIG. 4B, 5B or 6B on source/drain regions, respectively, of FET 200A, as illustrated in FIG. 10), other active components, passive components and interconnects, in the integrated circuit in order to generate a combined netlist for the entire integrated circuit.

The method can further comprise simulating the performance of an integrated circuit using the combined netlist that includes the netlist for the first conductive shape 213(a), which was generated at process 1108 based on the condensed resistance model selected from the model library 112 at process 1106 (1110). Techniques for simulating the performance of an integrated circuit based on a combined netlist are well known in the art and, thus, the details are omitted from this specification in order to allow the reader to focus on the salient aspects of the disclosed system. However, it should be understood that, because the resistance model for the first conductive shape 213(a) selected at process 1106 is a condensed resistance model, the netlist for the first conductive shape 213(a) generated at process 1108 will similarly be a condensed netlist as compared to a full netlist for the same shape. As a result, in the disclosed modeling method the number of simulation runs required at process 1110 to simulate the performance of the integrated circuit will be reduced and, thus, so will the overall simulation time.

Those skilled in the art will recognize that the results of integrated circuit performance simulation can be used to generate a performance model for the integrated circuit, as designed, and the performance model can be used as a basis for adjusting the design layout 111, if necessary (e.g., if performance specifications are not met). Once the design layout 111 is finalized, it can be used for integrated circuit test and/or manufacture. In other words, the above-described integrated circuit performance modeling method can be readily incorporated into a standard design flow used for integrated circuit design, simulation, test, layout, and manufacture.

Also disclosed herein is a computer program product for integrated circuit performance modeling. The computer program product can comprise a computer readable storage medium having program instructions embodied therewith (e.g., stored thereon). These program instructions can be executable by the computer to cause the computer to perform the above-described method. More particularly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
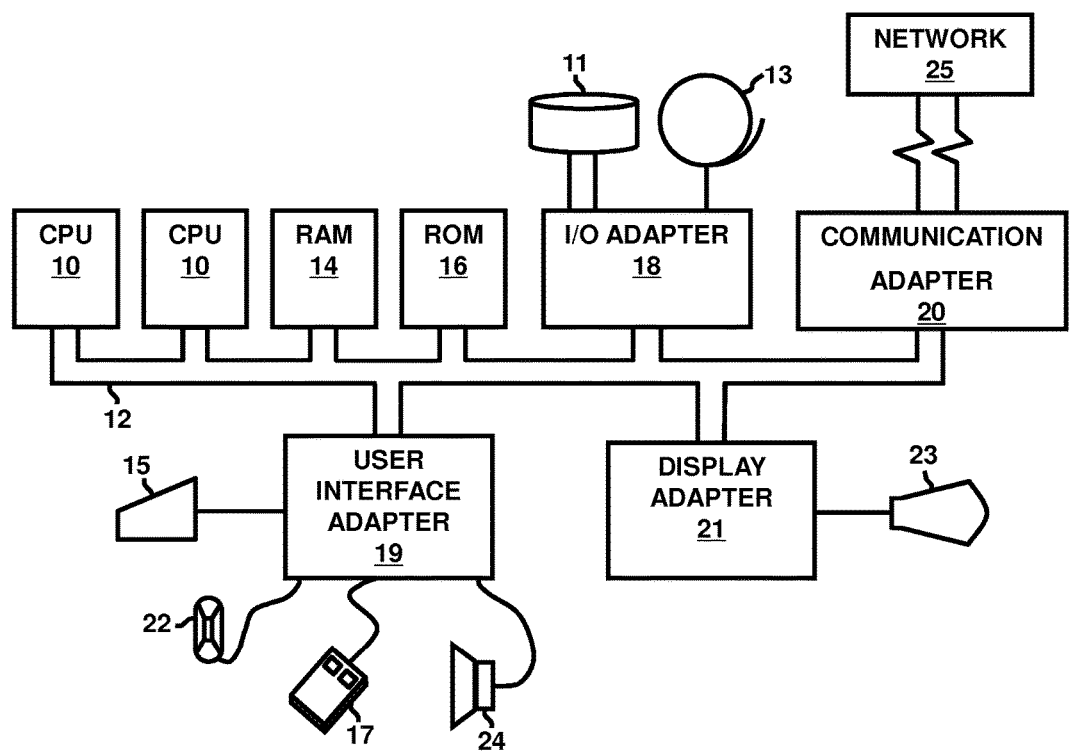
FIG. 12 depicts a representative hardware environment for implementing the disclosed integrated circuit performance modeling system and method.

FIG. 12 depicts a representative hardware environment (i.e., a computer system) for implementing integrated circuit performance modeling as disclosed herein. Specifically, this schematic drawing illustrates a hardware configuration of an information handling/computer system, which can be programmed with the various software programs described in detail above so as to become a special purpose computer for integrated circuit performance modeling. This computer system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are a system, a method and a computer program product for modeling the performance of an integrated circuit using a connectivity-based condensed resistance model for a conductive structure on a diffusion region of a semiconductor device within the integrated circuit. Specifically, in the system, method, and computer program product, the design layout of the integrated circuit can be analyzed in order to identify a first conductive shape (e.g., an internal local interconnect shape, a contact bar shape, or any other conductive shape) on a diffusion boundary shape of a semiconductor device and to also identify the first conductive shape's connectivity to any adjacent second conductive shapes (e.g., via shapes, via bar shapes, external local interconnect shapes or any other conductive shapes) inside and/or outside the limits of the diffusion boundary shape. A condensed resistance model can be generated for the first conductive shape based on the previously identified connectivity. This condensed resistance model can have a lesser number of nodes and/or a lesser number of resistive elements than a full resistance model for the conductive shape. The condensed resistance model can then be used to generate a condensed netlist, which can subsequently be used in a combined netlist to simulate the performance of the integrated circuit and, thereby save time.

What is claimed is:

1. An integrated circuit performance modeling system comprising:
   a memory storing a design layout of an integrated circuit and a model library, said memory being a non-transitory computer readable storage medium and said model library storing a plurality of connectivity-based condensed resistance models for conductive shapes; and,
   a computer comprising a tangible processor comprising:
      an integrated circuit design layout analyzer in communication with said memory, said integrated circuit design layout analyzer accessing said memory and, during an integrated circuit design flow, analyzing said design layout in order to identify, within said design layout, a diffusion boundary shape of a semiconductor device, a first conductive shape on said diffusion boundary shape, and any second conductive shapes connected to said first conductive shape and, said integrated circuit design layout analyzer further analyzing said design layout to determine, for each second conductive shape identified as being connected to said first conductive shape, a corresponding interface location of a point of connectivity between said second conductive shape and said first conductive shape relative to said diffusion boundary shape, said corresponding interface location being any of entirely outside said diffusion boundary shape and at least partially within said diffusion boundary shape;

a model selector in communication with said integrated circuit design layout analyzer and said model library, said model selector accessing said model library and selecting, from said model library, a specific condensed resistance model for said first conductive shape based on whether any corresponding interface locations between said first conductive shape and any second conductive shapes are entirely outside said diffusion boundary shape or at least partially within said diffusion boundary shape;

a netlist extractor in communication with said model selector and generating a condensed netlist for said first conductive shape based on said specific condensed resistance model; and a simulator in communication with said netlist extractor and simulating a performance of said integrated circuit using said condensed netlist for said first conductive shape, wherein said using of said condensed netlist for said first conductive shape as opposed to a full netlist for said first conductive shape to perform said simulating reduces a number of simulation runs required to complete said simulating, reduces overall processing time to complete said simulating and reduces processing capability required by said computer for performing said simulating.

2. The integrated circuit performance modeling system of claim 1, said specific condensed resistance model having at least one of a lesser number of nodes and a lesser number of resistive elements than a full resistance model for said first conductive shape.

3. The integrated circuit performance modeling system of claim 1, said first conductive shape comprising an internal local interconnect and said second conductive shape comprising any of a via shape, a via bar shape and an external local interconnect shape.

4. The integrated circuit performance modeling system of claim 1,
said first conductive shape having a bottom, a top, and opposing ends, and
said specific condensed resistance model having between two and four nodes and further having between one and three resistive elements, depending upon a first number of said second conductive shapes being connected to said first conductive shape at said opposing ends and entirely outside said diffusion boundary shape and a second number of said second conductive shapes being connected to said first conductive shape at said top and at least partially within said diffusion boundary shape.

5. The integrated circuit performance modeling system of claim 4, said first number being any one of zero and one, said second number being zero, and said specific condensed resistance model comprising two nodes.

6. The integrated circuit performance modeling system of claim 4, said first number being zero, said second number being at least one, and said specific condensed resistance model comprising two nodes.

7. The integrated circuit performance modeling system of claim 4, said first number being one, said second number being at least one, and said specific condensed resistance model comprising three nodes.

8. The integrated circuit performance modeling system of claim 4, said first number being two, said second number being zero, and said specific condensed resistance model comprising three nodes.

9. The integrated circuit performance modeling system of claim 4, said first number being two, said second number being at least one, and said specific condensed resistance model comprising four nodes.

10. A method of modeling integrated circuit performance, said method comprising:
accessing, by a tangible processor of a computer from a memory, a design layout of an integrated circuit, said memory being a non-transitory computer readable medium;
analyzing, by said processor during an integrated circuit design flow, a design layout of an integrated circuit in order to identify, in said design layout, a diffusion boundary shape of a semiconductor device, a first conductive shape on said diffusion boundary shape, and any second conductive shapes connected to said first conductive shape and further analyzing, by said computer, said design layout to determine, for each second conductive shape identified as being connected to said first conductive shape, a corresponding interface location of a point of connectivity between said second conductive shape and said first conductive shape relative to said diffusion boundary shape, said corresponding interface location being any of entirely outside said diffusion boundary shape and at least partially within said diffusion boundary shape;
accessing, by said processor, a model library that stores a plurality of connectivity-based condensed resistance models for conductive shapes;
selecting, by said processor from said model library, a specific condensed resistance model for said first conductive shape based on whether any corresponding interface locations between said first conductive shape and any second conductive shapes are entirely outside said diffusion boundary shape or at least partially within said diffusion boundary shape;
generating, said processor, a condensed netlist for said first conductive shape based on said specific condensed resistance model; and,
simulating, by said processor, a performance of said integrated circuit using said condensed netlist for said first conductive shape, wherein said using of said condensed netlist for said first conductive shape as opposed to a full netlist for said first conductive shape to perform said simulating reduces a number of simulation runs required to complete said simulating, reduces overall processing time to complete said simulating and reduces processing capability required by said computer for performing said simulating.

11. The method of claim 10, said specific condensed resistance model having at least one of a lesser number of nodes and a lesser number of resistive elements than a full netlist for said first conductive shape.

12. The method of claim 10, said first conductive shape comprising an internal local interconnect shape and said second conductive shape comprising any of a via shape, a via bar shape and an external local interconnect shape.

13. The method of claim 10,
said first conductive shape having a bottom, a top, and opposing ends, and
said specific condensed resistance model having between two and four nodes and further having between one and three resistive elements, depending upon a first number of said second conductive shapes being connected to said first conductive shape at said opposing ends and entirely outside said diffusion boundary shape and a second number of said second conductive shapes being connected to said first conductive shape at said top and at least partially within said diffusion boundary shape.

14. The method of claim 13, said first number being any one of zero and one, said second number being zero, and said specific condensed resistance model comprising two nodes.

15. The method of claim 13, said first number being zero, said second number being at least one, and said specific condensed resistance model comprising two nodes.

16. The method of claim 13, said first number being one, said second number being at least one, and said specific condensed resistance model comprising three nodes.

17. The method of claim 13, said first number being two, said second number being zero, and said specific condensed resistance model comprising three nodes.

18. The method of claim 13, said first number being two, said second number being at least one, and said specific condensed resistance model comprising four nodes.

19. A computer program product for integrated circuit performance modeling, said computer program product comprising a non-transitory computer readable storage medium having program instructions embodied therewith, said program instructions being executable by a tangible processor of a computer to cause said computer to perform a method, said method comprising:

during an integrated circuit design flow, analyzing a design layout of an integrated circuit in order to identify, in said design layout, a diffusion boundary shape of a semiconductor device, a first conductive shape on said diffusion boundary shape, and any second conductive shapes connected to said first conductive shape and further analyzing said design layout to determine, for each second conductive shape identified as being connected to said first conductive shape, a corresponding interface location of a point of connectivity between said second conductive shape and said first conductive shape relative to said diffusion boundary shape, said corresponding interface location being any of outside said diffusion boundary shape and at least partially within said diffusion boundary shape;

accessing a model library that stores a plurality of connectivity-based condensed resistance models for conductive shapes;

selecting, from said model library, a specific condensed resistance model for said first conductive shape based on whether any corresponding interface locations between said first conductive shape and any second conductive shapes are entirely outside said diffusion boundary shape or partially within said diffusion boundary shape;

generating a condensed netlist for said first conductive shape based on said specific condensed resistance model; and, simulating a performance of said integrated circuit using said condensed netlist for said first conductive shape, wherein said using of said condensed netlist for said first conductive shape as opposed to a full netlist for said first conductive shape to perform said simulating reduces a number of simulation runs required to complete said simulating, reduces overall processing time to complete said simulating and reduces processing capability required by said computer for performing said simulating.

20. The computer program product of claim 19,
said first conductive shape having a bottom, a top, and opposing ends, and
said specific condensed resistance model having between two and four nodes and further having between one and three resistive elements, depending upon a first number of said second conductive shapes being connected to said first conductive shape at said opposing ends and entirely outside said diffusion boundary shape and a second number of said second conductive shapes being connected to said first conductive shape at said top and at least partially within said diffusion boundary shape.

* * * * *